United States Patent
Ikeda et al.

(10) Patent No.: US 9,954,531 B2
(45) Date of Patent: Apr. 24, 2018

(54) ELECTRONIC DEVICE

(71) Applicant: Semiconductor Energy Laboratory Co., LTD., Atsugi-shi, Kanagawa-ken (JP)

(72) Inventors: Takayuki Ikeda, Kanagawa (JP); Munehiro Kozuma, Kanagawa (JP); Takeshi Aoki, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 10 days.

(21) Appl. No.: 15/050,699

(22) Filed: Feb. 23, 2016

(65) Prior Publication Data

US 2016/0261272 A1 Sep. 8, 2016

(30) Foreign Application Priority Data

Mar. 3, 2015 (JP) .................................. 2015-040855

(51) Int. Cl.
*H03K 19/177* (2006.01)
*H03K 19/00* (2006.01)

(52) U.S. Cl.
CPC ... *H03K 19/17724* (2013.01); *H03K 19/0008* (2013.01); *H03K 19/1774* (2013.01); *H03K 19/1776* (2013.01); *H03K 19/17776* (2013.01)

(58) Field of Classification Search
CPC ......... H03K 19/17724; H03K 19/1774; H03K 19/0008; H03K 19/1776; H03K 19/17776
USPC ...................................... 326/37–50, 101–103
See application file for complete search history.

(56) References Cited

U.S. PATENT DOCUMENTS

| | | | | |
|---|---|---|---|---|
| 5,426,378 | A * | 6/1995 | Ong | .................... H03K 19/1737 326/38 |
| 7,193,437 | B2 * | 3/2007 | Cappelli | ........... H01L 27/11803 257/E27.107 |
| 8,476,927 | B2 | 7/2013 | Nishijima | |
| 8,547,753 | B2 | 10/2013 | Takemura et al. | |
| 8,587,336 | B2 * | 11/2013 | Sueyoshi | ......... H03K 19/17728 326/37 |
| 8,675,382 | B2 | 3/2014 | Kurokawa | |

(Continued)

OTHER PUBLICATIONS

Waidyasooriya.H et al., "Implementation of a Partially Reconfigurable Multi-Context FPGA Based on Asynchronous Architecture", IEICE Trans. Electron. (IEICE Transactions on Electronics), Apr. 1, 2009, vol. E92-C, No. 4, pp. 539-549.

*Primary Examiner* — Dylan White
(74) *Attorney, Agent, or Firm* — Nixon Peabody LLP; Jeffrey L. Costellia

(57) ABSTRACT

A novel electronic device including a reconfigurable circuit is provided. In the electronic device including a reconfigurable circuit capable of executing multi-context operation, a context selection signal is locally generated. For example, a context selection signal is generated in the reconfigurable circuit with the use of context determination data contained in an output of another logic block, for example. The range of application of the context selection signal can be set as appropriate by a user. Thus, multi-context operation performed locally and partly enables efficient use of the circuit. Memory usage can be reduced and its efficiency can be improved compared to the case of using global multi-context driving. Other embodiments may be disclosed and claimed.

14 Claims, 19 Drawing Sheets

(56) References Cited

U.S. PATENT DOCUMENTS

| | | |
|---|---|---|
| 8,760,931 B2 | 6/2014 | Takemura et al. |
| 8,891,281 B2 | 11/2014 | Kurokawa |
| 8,970,251 B2 | 3/2015 | Kurokawa |
| 9,065,438 B2 | 6/2015 | Aoki et al. |
| 9,165,942 B2 | 10/2015 | Nishijima |
| 9,172,370 B2 * | 10/2015 | Ikeda ................. H03K 19/0016 |
| 9,276,577 B2 * | 3/2016 | Kurokawa ..... H03K 19/018521 |
| 9,287,878 B2 * | 3/2016 | Bjorklund .......... H03K 19/1776 |
| 9,305,612 B2 | 4/2016 | Kurokawa |
| 2013/0293263 A1 | 11/2013 | Kurokawa |
| 2013/0314124 A1 | 11/2013 | Ikeda et al. |
| 2014/0159771 A1 | 6/2014 | Ikeda et al. |
| 2014/0252346 A1 | 9/2014 | Takemura et al. |
| 2014/0368235 A1 | 12/2014 | Aoki et al. |
| 2015/0008958 A1 * | 1/2015 | Kurokawa ..... H03K 19/018521 326/41 |
| 2015/0171865 A1 | 6/2015 | Kurokawa |
| 2015/0381182 A1 * | 12/2015 | Lin ................. H03K 19/17752 326/38 |
| 2016/0322975 A1 | 11/2016 | Ikeda et al. |

* cited by examiner

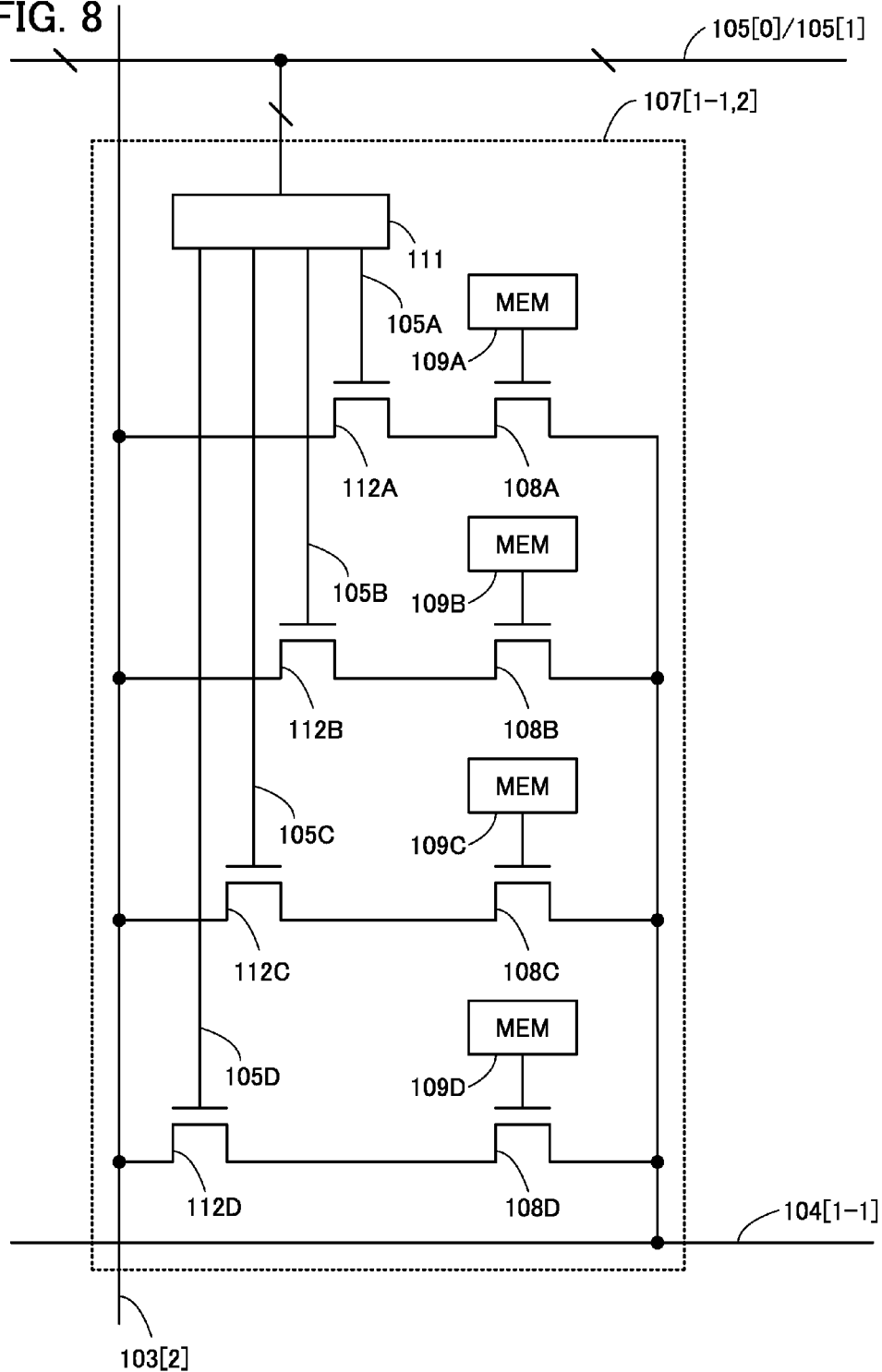

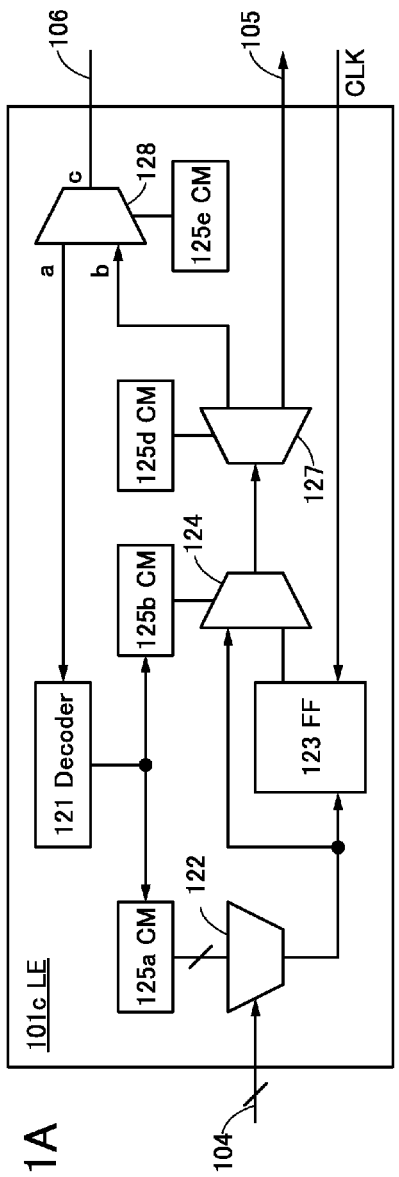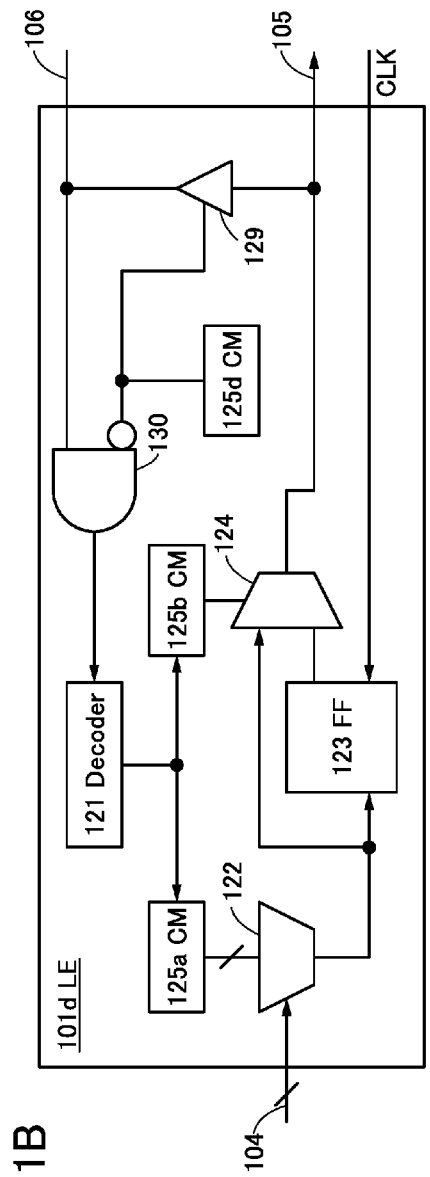
FIG. 11A
FIG. 11B

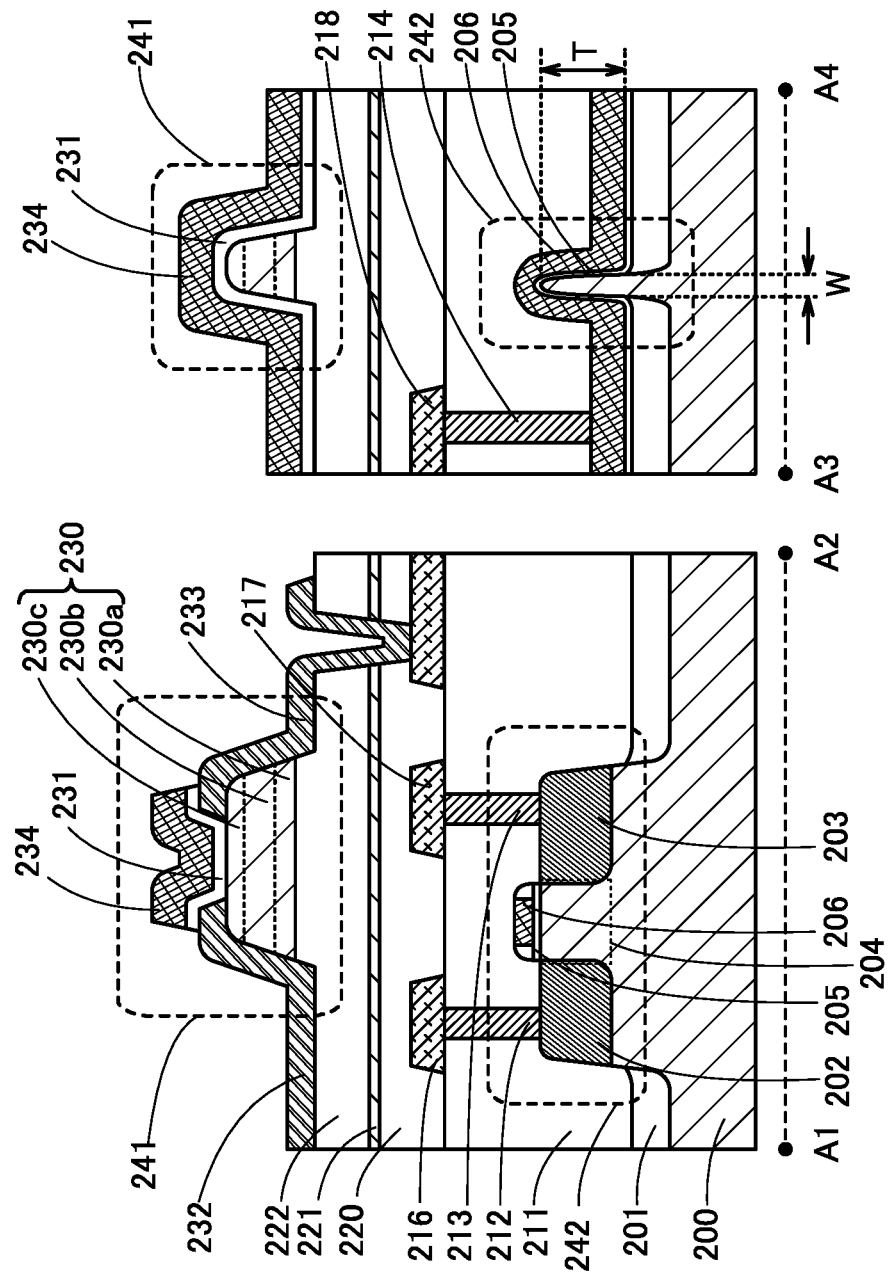

ELECTRONIC DEVICE

BACKGROUND OF THE INVENTION

1. Field of the Invention

This disclosure is related to electronic devices.

2. Description of the Related Art

A multi-context reconfigurable device in which a configuration can be instantaneously switched is suggested (e.g., Non-Patent Document 1). For example, Patent Documents 1 to 5 each propose a field-programmable gate array (FPGA) that includes a transistor containing an oxide semiconductor in a channel formation region (hereinafter referred to as OS transistor) and functions as a multi-context reconfigurable circuit.

Patent Documents 1 to 5 each disclose that the use of a memory including an OS transistor as a configuration memory for storing configuration data enables configuration memories to be arranged at a high density, resulting in high degree of integration of configuration memories. This fact is suitable for a multi-context system.

Since unused configuration data are held in a set of configuration memories in a multi-context system, an OS memory consuming low power in data retention is preferable. Moreover, the boosting effect sometimes increases the switching speed of a routing switch.

REFERENCE

Patent Document

Patent Document 1: United States Patent Application Publication No. 2013/0293263

Patent Document 2: United States Patent Application Publication No. 2013/0314124

Patent Document 3: United States Patent Application Publication No. 2014/0159771

Patent Document 4: United States Patent Application Publication No. 2014/0368235

Patent Document 5: United States Patent Application Publication No. 2015/0008958

Non-Patent Document

Non-Patent Document 1: H. M. Waidyasooriya et al., "Implementation of a Partially Reconfigurable Multi-Context FPGA Based on Asynchronous Architecture", IEICE TRANSACTIONS on Electronics, Vol. E92-C, pp. 539-549, 2009.

SUMMARY OF THE INVENTION

This disclosure provides a novel electronic device or the like. For example, this disclosure discloses at least one of the following: an electronic device or the like capable of being driven at higher speed, an electronic device or the like with lower power consumption, an electronic device or the like with higher degree of integration, an electronic device or the like with higher added value, an electronic device or the like with higher usability, an electronic device or the like with lower manufacturing cost, an electronic device or the like with higher versatility, an electronic device or the like capable of meeting user's demand more easily, and an electronic device or the like capable of being used more efficiently. Embodiments 1 to 3 can be referred to for an object that can be solved by these electronic devices or the like.

One electronic device disclosed herein includes a plurality of switch matrix arrays, a plurality of logic elements corresponding to the respective switch matrix arrays, and a plurality of wirings. Each of the plurality of switch matrix arrays is configured to select at least one wiring among the plurality of wirings and input, to the corresponding logic element, a signal transmitted through the at least one wiring. One logic element among the plurality of logic elements is configured to supply a context selection signal to the plurality of switch matrix arrays except one switch matrix array corresponding to the one logic element and one of the plurality of logic elements except the one logic element. The context selection signal is generated by using a signal input to the one logic element through at least one of the plurality of wirings. Another electronic device disclosed herein includes a first logic element, a second logic element, a first switch matrix array corresponding to the first logic element, a second switch matrix array corresponding to the second logic element, and a plurality of wirings. The first switch matrix array is configured to select at least one of the plurality of wirings and input a first signal to the first logic element. The second switch matrix array is configured to select at least one of the plurality of wirings and input a second signal to the second logic element. The first logic element is configured to generate a context selection signal by using part or all of the first signal. The context selection signal is input to at least one of the second logic element and the second switch matrix array. Another electronic device disclosed herein includes a first logic block and a second logic block. A logic structure of the first logic block and a logic structure of the second logic block are capable of being changed by a context selection signal. The first logic block is configured to generate a first context selection signal by using first context determination data contained in a first signal input to the first logic block, execute first arithmetic with a first logic structure corresponding to the first context selection signal, and output a second signal containing a result of the first arithmetic. The second logic block is configured to generate a second context selection signal by using second context determination data contained in the second signal, and execute second arithmetic with a second logic structure corresponding to the second context selection signal. Note that the first logic block may include a plurality of logic elements and a plurality of switch matrix arrays. In the above electronic devices, the context selection signal may be generated using a clock signal. The above electronic devices may include a transistor containing an oxide semiconductor in a channel formation region.

The novel electronic devices or the like are disclosed as described above. The details or other embodiments of the electronic devices will be described below.

BRIEF DESCRIPTION OF THE DRAWINGS

In the accompanying drawings:

FIG. 8 is a circuit diagram illustrating a structure example of a switch circuit;

FIGS. 11A and 11B are block diagrams each illustrating a structure example of a logic element;

FIG. 17 is a cross-sectional view illustrating a structure example of an electronic device;

DETAILED DESCRIPTION OF THE INVENTION

Figure 1:
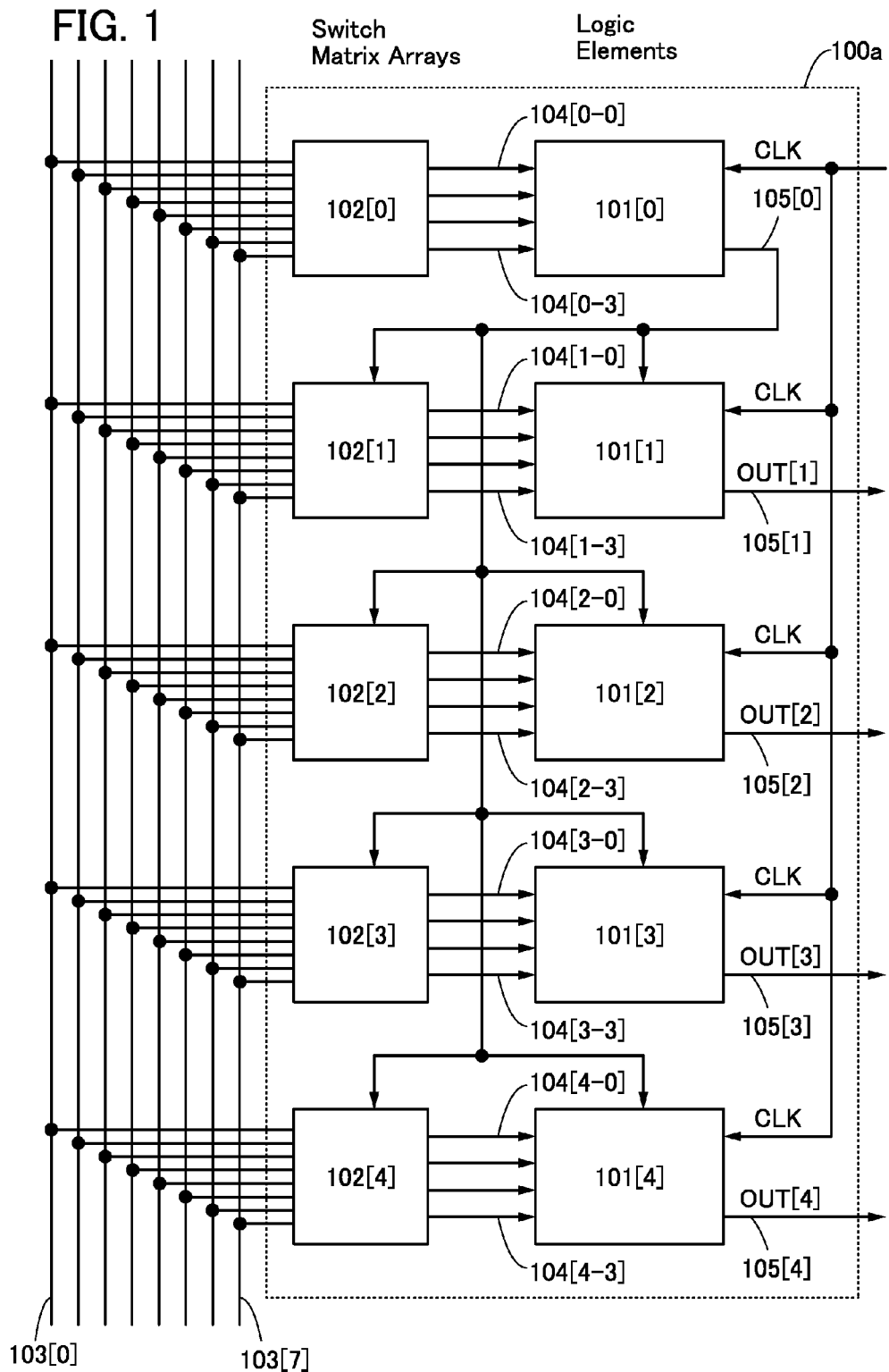
FIG. 1 illustrates a structure example of a logic block.

Embodiments will be hereinafter described with reference to the accompanying drawings. Note that embodiments can be carried out in many different modes, and it is easily understood by those skilled in the art that modes and details of the present invention can be modified in various ways without departing from the spirit and scope of the present invention. Thus, the present invention should not be interpreted as being limited to the following description of the embodiments.

In the drawings, the same elements or elements having similar functions, elements formed using the same material, elements formed at the same time, or the like are sometimes denoted by the same reference numerals, and the description thereof is not repeated in some cases. A technology disclosed in one embodiment can be applied to any other embodiment.

Embodiment 1

In this embodiment, a structure of an electronic device in one embodiment of the present invention will be described with reference to FIG. 1. FIG. 1 illustrates a structure of a logic block 100a included in an electronic device.

The logic block 100a illustrated in FIG. 1 includes a plurality of logic elements (logic elements 101[0] to 101[4]), a plurality of switch matrix arrays (switch matrix arrays 102[0] to 102[4]), and a plurality of wirings (wirings 103[0] to 103[7]; a wiring can also be referred to as a route or routing).

Signals transmitted through the wirings 103[0] to 103[7] can be input to the logic elements 101[0] to 101[4] through the switch matrix arrays 102[0] to 102[4]. In the example of FIG. 1, signals from the eight wirings 103 can be input to each switch matrix array 102, and up to four signals among these are selected in accordance with configuration data stored in each switch matrix array 102 and active context and are supplied to a corresponding logic element 101 through a wiring 104. For example, signals are input to the logic element 101[1] through the wirings 104[1-0] to 104[1-3].

The logic element 101 performs arithmetic processing in response to stored configuration data and active context, or a clock signal CLK, for example, and outputs the result. Here, the logic elements 101[1] to 101[4] output arithmetic results to wirings 105[1] to 105[4] as output signals OUT[1] to OUT[4]. Although not illustrated, the output signals OUT[1] to OUT[4] can be supplied to the logic elements 101 (including ones not shown) through the switch matrix arrays 102 (including ones not shown). The output signals OUT[1] to OUT[4] can be supplied indirectly to the wirings 103[0] to 103[7]. Moreover, the output signal OUT from the logic element 101 may be output to two or more wirings.

Aside from this, the logic element 101[0] performs arithmetic processing in a similar manner; an output (context selection signal) is supplied to the logic elements 101[1] to 101[4] and the switch matrix arrays 102[1] to 102[4] through a wiring 105[0]. Then, the logic elements 101[1] to 101[4] and the switch matrix arrays 102[1] to 102[4] change a configuration in response to the context selection signal received through the wiring 105[0], and execute a specified context.

The description is made on an example where the logic block 100a in FIG. 1 implements a plurality of contexts, here an example where arithmetic A and arithmetic B are successively executed. That is, the arithmetic A is executed as context A, and the arithmetic B is executed as the context B. Thus, the context needs to be changed after the arithmetic A is finished.

Here, it is assumed that the potential of the wiring 103[0] becomes low (L) and the potential of the wiring 103[1] becomes high (H) when the arithmetic A is finished. For example, it is designed or set so that such signals are supplied from any of the logic elements 101 (including ones not shown) or an input terminal (not shown).

A context selection signal is generated by the logic element 101[0] and output to the wiring 105[0]. For example, the potential of the wiring 105[0] is set L to select the context A (for executing the arithmetic A) and is set H to select the context B (for executing the arithmetic B).

For example, the switch matrix array 102[0] is set so as to supply, to the logic element 101[0], at least signals from the wirings 103[0] and 103[1]. Needless to say, the switch matrix array 102[0] may be set so as to also supply, to the logic element 101[0], a signal from a wiring other than the wirings 103[0] and 103[1].

Note that the logic element 101[0] is set such that H is output to the wiring 105[0] (regardless of other signals input to the logic element 101[0]) when the potential of the wiring 103[0] is L and the potential of the wiring 103[1] is H (meaning that the arithmetic A is finished), and L is output to the wiring 105[0] (regardless of other signals input to the logic element 101[0]) when the wirings 103[0] and 103[1] have the other potentials.

The potential of the wiring 105[0] is L when the arithmetic A is not finished. The context of the logic elements 101[1] to 101[4] and the switch matrix arrays 102[1] to 102[4] is set to the context A. When the arithmetic A is finished and the potential of the wiring 105[0] becomes H, the context of the logic elements 101[1] to 101[4] and the switch matrix arrays 102[1] to 102[4] is changed to the context B, and the arithmetic B is executed.

Since a signal for context switching is locally generated in such a manner, context switching can be performed at extremely high speed. For example, context switching can be completed within approximately one clock cycle.

Figure 2:
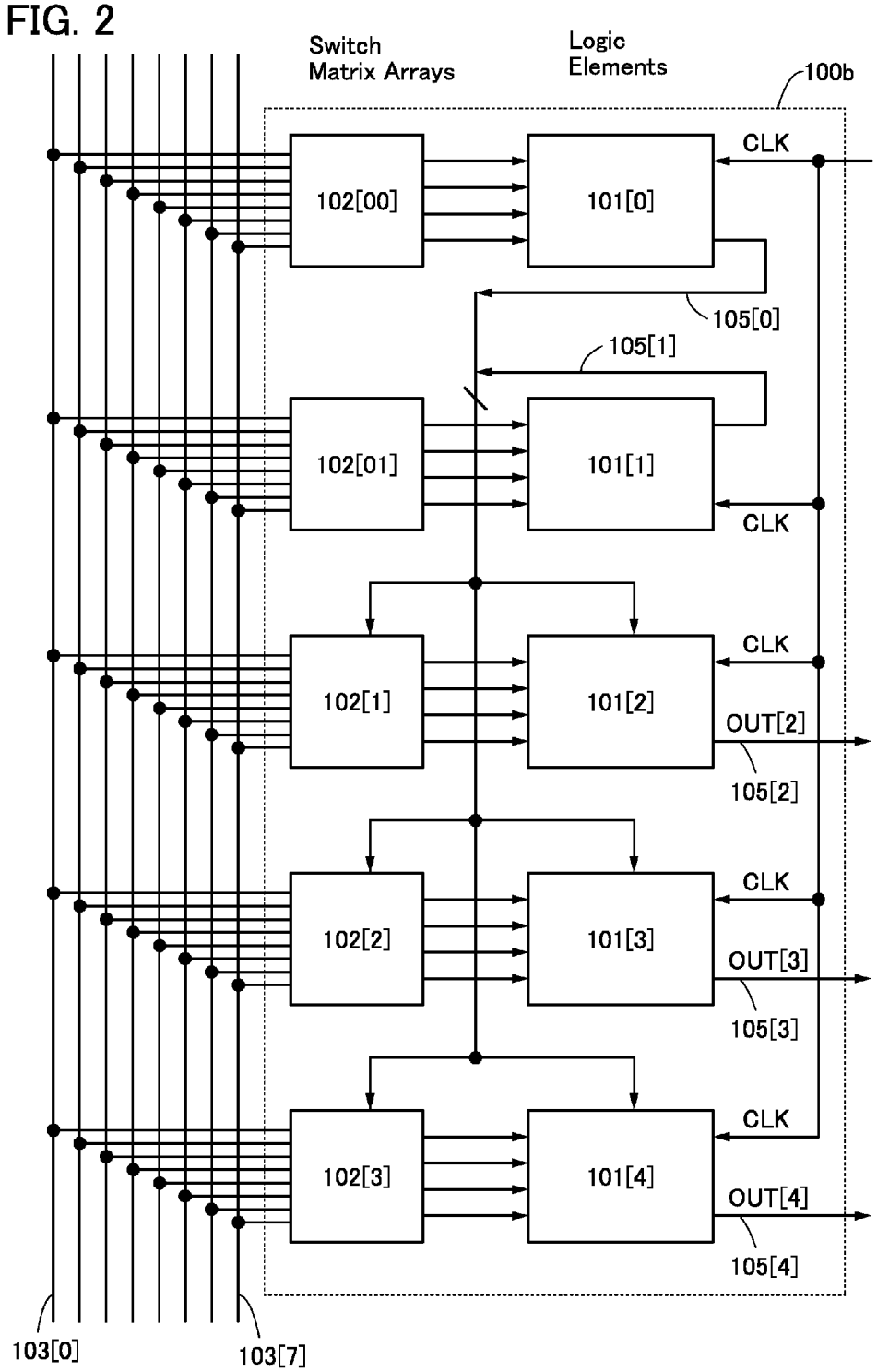
FIG. 2 illustrates a structure example of a logic block.

FIG. 2 illustrates another example. A logic block 100b in FIG. 2 differs from the logic block 100a in FIG. 1 in that output signals of the two logic elements 101[0] and 101[1] are a 2-bit context selection signal. That is, the output signal of the logic element 101[0] is supplied to the wiring 105[0], and the output signal of the logic element 101[1] is supplied to the wiring 105[1].

The logic elements 101[2] to 101[4] and the switch matrix arrays 102[2] to 102[4] can select a context in accordance with a 2-bit context selection signal, that is, can select four contexts at the maximum. When the number of logic elements 101 supplying a context selection signal increases, the number of bits of a context selection signal increases accordingly, resulting in a larger number of contexts to be selected.

Similar operation can be performed by output of signals from a plurality of wirings of the logic element 101 generating a context selection signal. For example, when the logic element 101[0] outputs a 1-bit signal to each of two wirings, a 2-bit context selection signal can be output as in the above.

Given that the arithmetic A, the arithmetic B, arithmetic C, and arithmetic D are successively executed, the logic block 100b in FIG. 2, which can select four contexts at the maximum, is set as follows, for example. To execute the arithmetic A, the potentials of the wirings 103[0] and 103[1] are L. To execute the arithmetic B, the potential of the wiring 103[0] is L and that of the wiring 103[1] is H. To execute the arithmetic C, the potential of the wiring 103[0] is set H and that of the wiring 103[1] is L. To execute the arithmetic D, the potentials of the wirings 103[0] and 103[1] are H.

Furthermore, for example, the logic element 101[0] is set to output L to the wiring 105[0] when a signal of the wiring 103[0] is L and output H to the wiring 105[0] when a signal of the wiring 103[0] is H. The logic element 101[1] is set to output L to the wiring 105[1] when a signal of the wiring 103[1] is L and output H to the wiring 105[1] when a signal of the wiring 103[1] is H.

Signals of the wirings 105[0] and 105[1] are decoded in the logic elements 101[2] to 101[4] and the switch matrix arrays 102[2] to 102[4], and the context of the logic elements 101[2] to 101[4] and the switch matrix arrays 102[2] to 102[4] is changed on the basis of the decoded signals.

Figure 3:
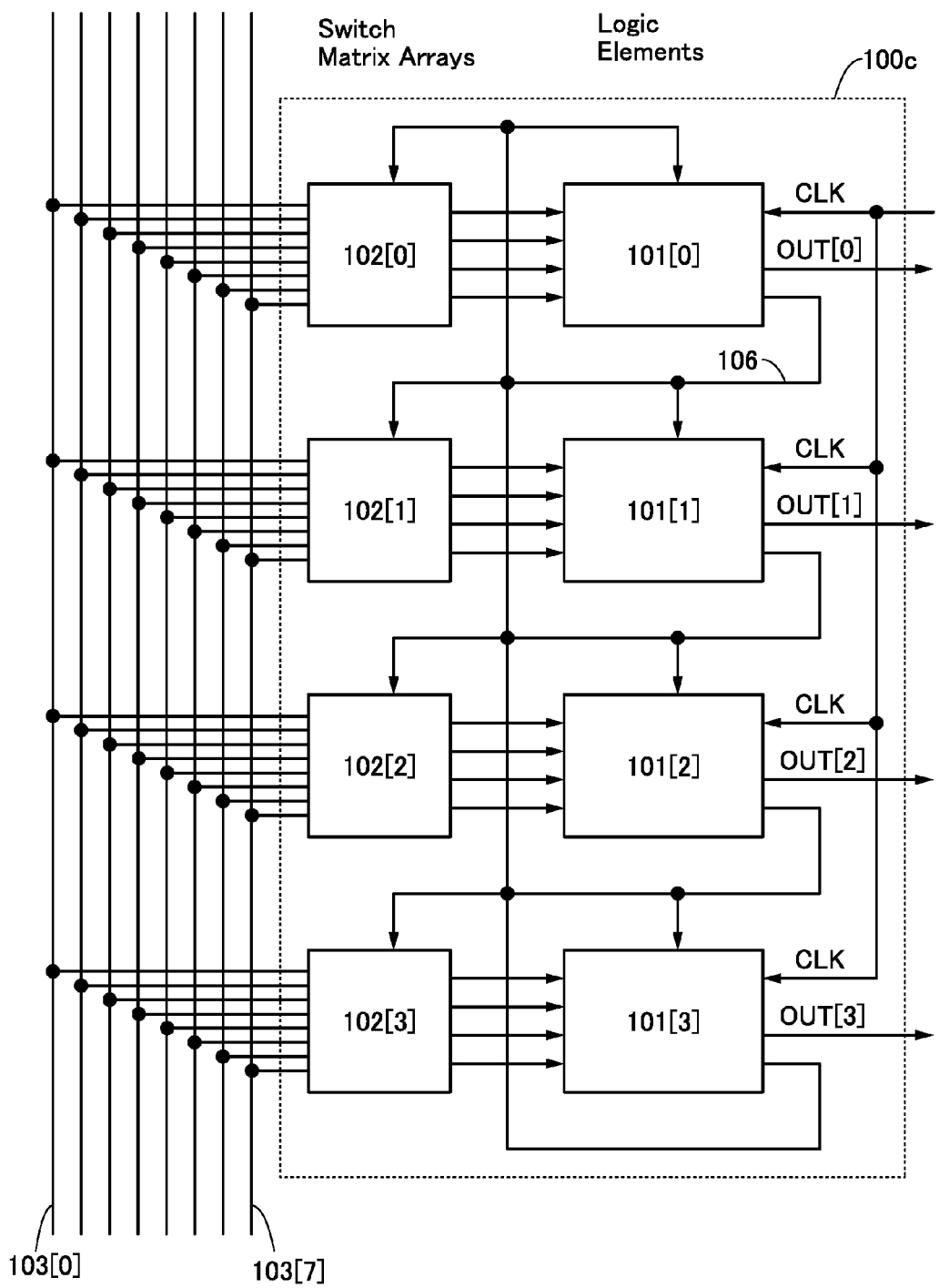
FIG. 3 illustrates a structure example of a logic block.

Although the logic element 101 for generating a context selection signal is fixed in the examples of FIG. 1 and FIG. 2, any of the logic elements 101[0] to 101[3] may generate a context selection signal as illustrated in FIG. 3, for example.

In a logic block 100c illustrated in FIG. 3, the logic elements 101[0] to 101[3] output arithmetic results as output signals OUT[0] to OUT[3], or output as context selection signals to a context selection signal line 106.

Specifically, one of the logic elements 101[0] to 101[3] generates a context selection signal and outputs the context selection signal to the context selection signal line 106. For a context selection signal of two or more bits, at least two of the logic elements 101[0] to 101[3] output a context selection signal, and a plurality of context selection signal lines 106 corresponding to the number of bits of a context selection signal are used. Alternatively, one of the logic elements 101[0] to 101[3] may output a context selection signal of two or more bits to the context selection signal lines 106, the number of which corresponds to the number of bits.

The logic element 101 generating a context selection signal is designed or set so as not to receive a signal from the context selection signal line 106. Alternatively, when it is designed so as to receive a signal from the context selection signal line 106, configuration data for maintaining the same configuration regardless of a context selection signal may be input thereto.

The others of the logic elements 101[0] to 101[3] (except the one generating a context selection signal) do not output a context selection signal and moreover, are designed or set so as to receive a signal from the context selection signal line 106. That is, the circuit structure and logic structure of the logic element 101 are set depending on whether to output a context selection signal.

The structure such as the one shown in FIG. 3 has an effect similar to that of a structure where the number of input signal lines of the logic element 101 is increased from four to five; thus, more complicated arithmetic is possible with the logic element 101. Meanwhile, where to connect the input signal lines is limited, preventing an increase in the layout area.

In the logic block 100c of FIG. 3, a terminal for receiving a context selection signal and a terminal for outputting a context selection signal are shown as different terminals. However, in an actual circuit, one terminal can be used for both input and output. For example, a circuit illustrated in FIG. 4 may be employed.

Figure 4:
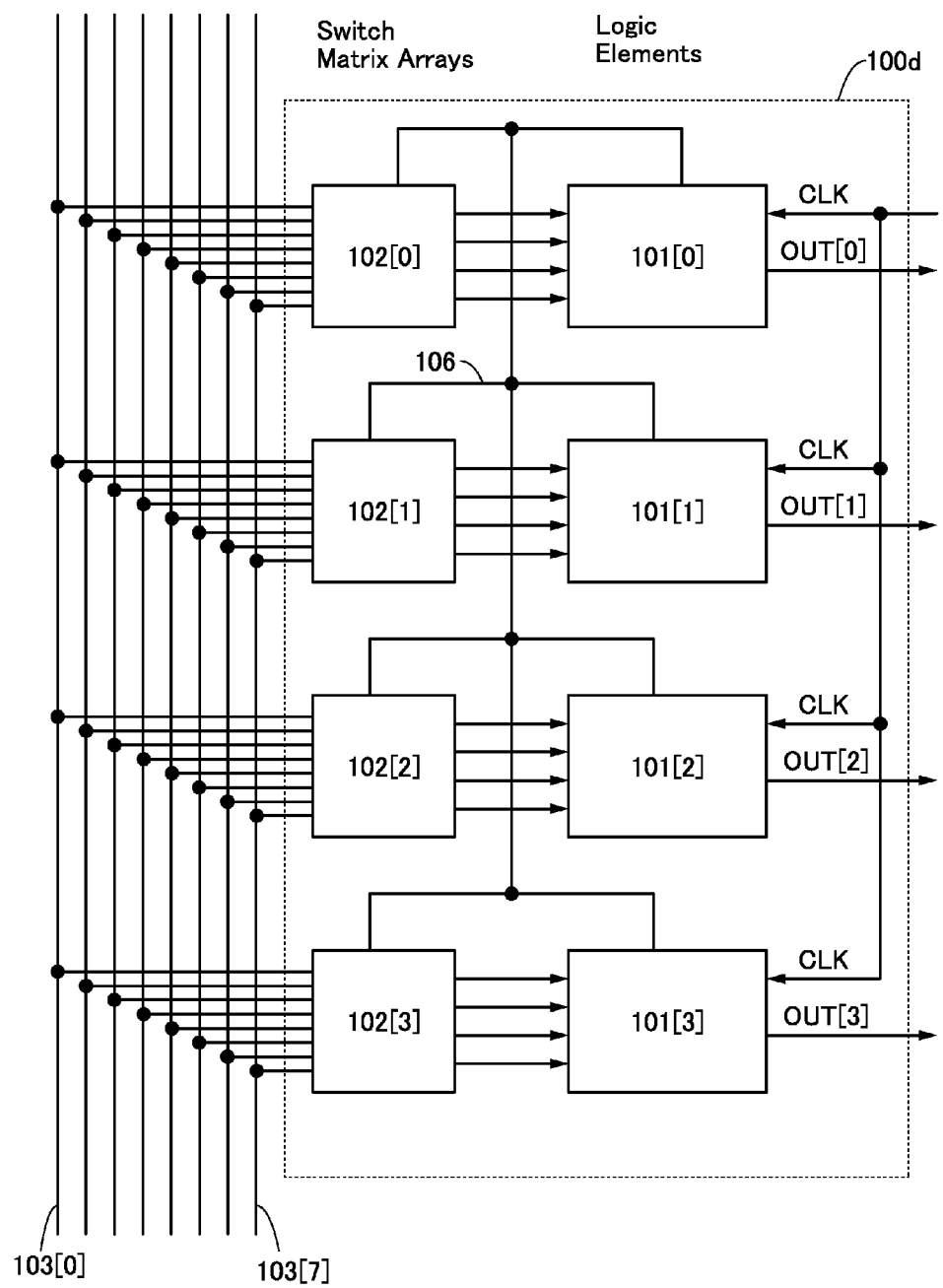
FIG. 4 illustrates a structure example of a logic block.

In a logic block 100d of FIG. 4, each of the logic elements 101 is shown as being connected to the context selection signal line 106 through one terminal. Whether to receive or output a context selection signal can be determined by an internal circuit structure of the logic element 101. A specific example will be described later as a structure example of the logic element 101.

Although a context selection signal is generated only from signals transmitted through the wirings 103 in the above examples, it may be generated using another signal, for example, a signal transmitted through at least one wiring 103 and a clock signal.

Figure 5:
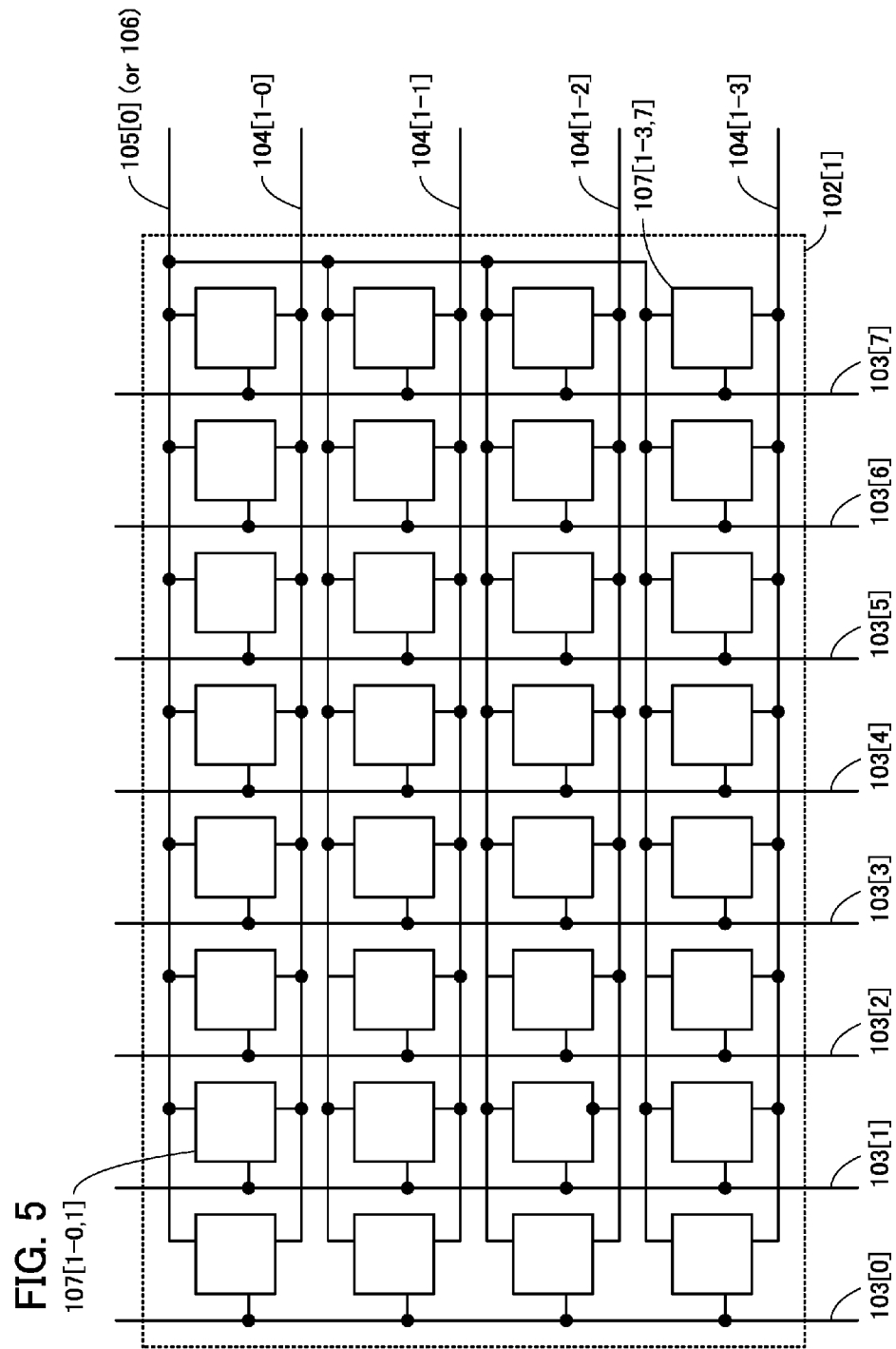
FIG. 5 illustrates a structure example of a switch matrix array.

FIG. 5 illustrates an example of the switch matrix array 102. The switch matrix array 102[1] in FIG. 5 is provided to overlap with the wirings 103[0] to 103[7] and the wirings 104[1-1] to 104[1-4]. The wirings 104[1-1] to 104[1-4] supply signals to the logic element 101[1].

The switch matrix array 102[1] includes a plurality of switch circuits 107 arranged in a matrix. Each switch circuit 107 establishes and breaks electrical connection between the corresponding wiring 103 and wiring 104. For example, the switch circuit 107[1-0,1] establishes and breaks electrical connection between the wiring 103[1] and the wiring 104[1-0], and the switch circuit 107[1-3,7] establishes and breaks electrical connection between the wiring 103[7] and the wiring 104[1-3]. The operation of the switch circuit 107 can be changed in response to a context selection signal transmitted through the wiring 105[0] (or the context selection signal line 106).

Figure 6A:
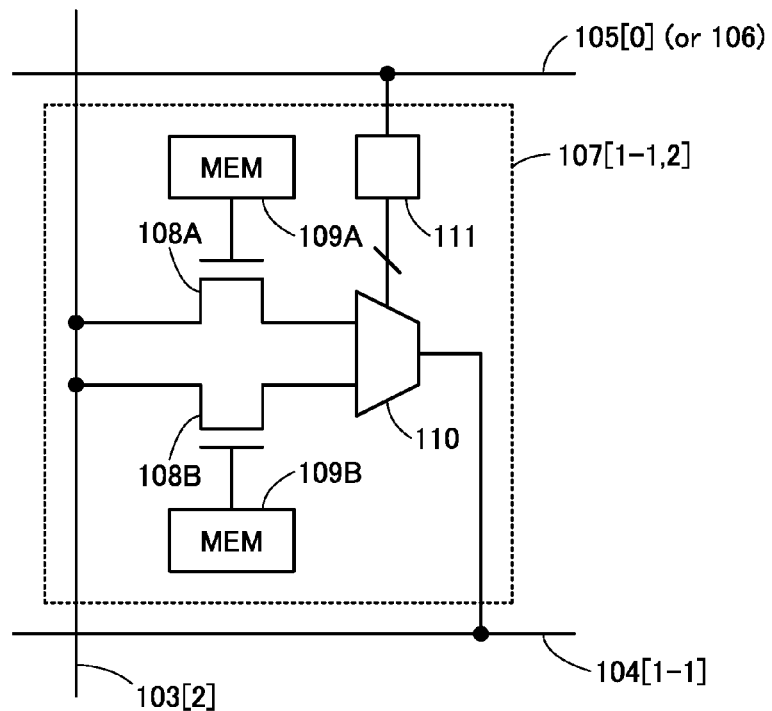
FIGS. 6A to 6C are circuit diagrams illustrating a structure example of a switch circuit.

The switch circuit 107[1-1,2] that establishes and breaks electrical connection between the wiring 103[2] and the wiring 104[1-1] includes a pass transistor 108A, a pass transistor 108B, a memory 109A, a memory 109B, a 2-input multiplexer 110, and a decoder 111 as illustrated in FIG. 6A, for example. The switch circuit 107[1-1,2] in FIG. 6A can select and implement one of two contexts (the context A and the context B). From the decoder 111, a signal is supplied to the multiplexer 110 through at least one wiring.

Figure 6B:
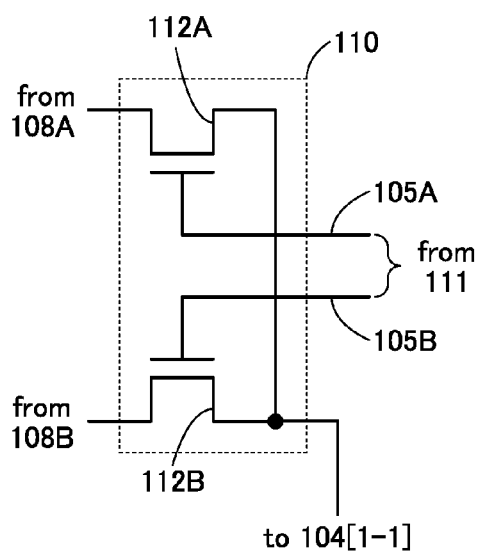
Figure 6C:
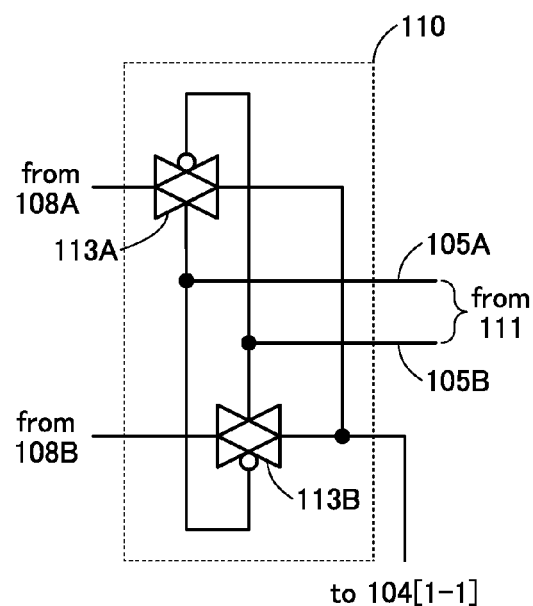

The multiplexer 110 can be expressed, for example, as a circuit including a selection transistor 112A and a selection transistor 112B as illustrated in FIG. 6B or, as illustrated in FIG. 6C, expressed using a pair of transfer gates (a transfer gate 113A and a transfer gate 113B) that operate differently from each other. In these examples, the selection transistors 112A and 112B and the transfer gates 113A and 113B are controlled by two wirings (a control signal line 105A and a control signal line 105B) from the decoder 111.

A signal transmitted through the wiring 105[0] (or the context selection signal line 106) is decoded by the decoder 111. In accordance with a context selection signal, the decoder 111 supplies potentials that set one of the control signal lines 105A and 105B to H and the other to L to the control signal lines 105A and 105B.

For example, the decoder 111 supplies potentials with which the potential of the control signal line 105A becomes H and the potential of the control signal line 105B becomes L when the potential of the wiring 105[0] is L whereas the potential of the control signal line 105A becomes L and the potential of the control signal line 105B becomes H when the potential of the wiring 105[0] is H.

When the transfer gates 113A and 113B are used as in FIG. 6C, the aforementioned relation between the potentials of the control signal lines 105A and 105B is advantageous in the following aspect.

While both H and L signals are input to one transfer gate for control, both H and L signals are output from the decoder 111 all the time. Accordingly, these potentials can be used to control the transfer gates 113A and 113B, resulting in faster operation.

The on/off states of the pass transistors 108A and 108B are controlled with outputs of the memories 109A and 109B (each of these outputs is equivalent to 1-bit data stored in the corresponding memory).

When the circuit shown in FIG. 6B is used as the multiplexer 110, a source and a drain of the pass transistor 108A are placed between the wiring 103[2] and a source (or a drain) of the selection transistor 112A; alternatively, the source and the drain of the selection transistor 112A may be placed between the wiring 103[2] and the source (or the drain) of the pass transistor 108A. The same applies to the case of using the circuit shown in FIG. 6C.

Figure 7A:
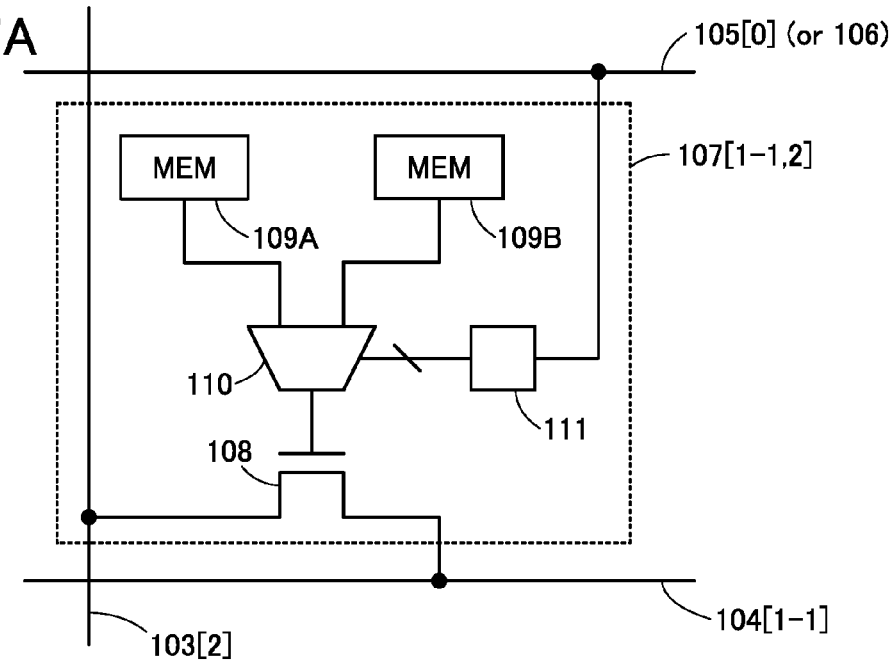
FIGS. 7A and 7B are circuit diagrams each illustrating a structure example of a switch circuit.

FIG. 7A illustrates a variation example. In the switch circuit 107[1-1,2] in FIG. 7A, output signals of the memories 109A and 109B are selected by the multiplexer 110, and the selected signal is input to a gate of a pass transistor 108. The multiplexer 110 is controlled with an output signal of the decoder 111 as in FIG. 6A.

Figure 7B:
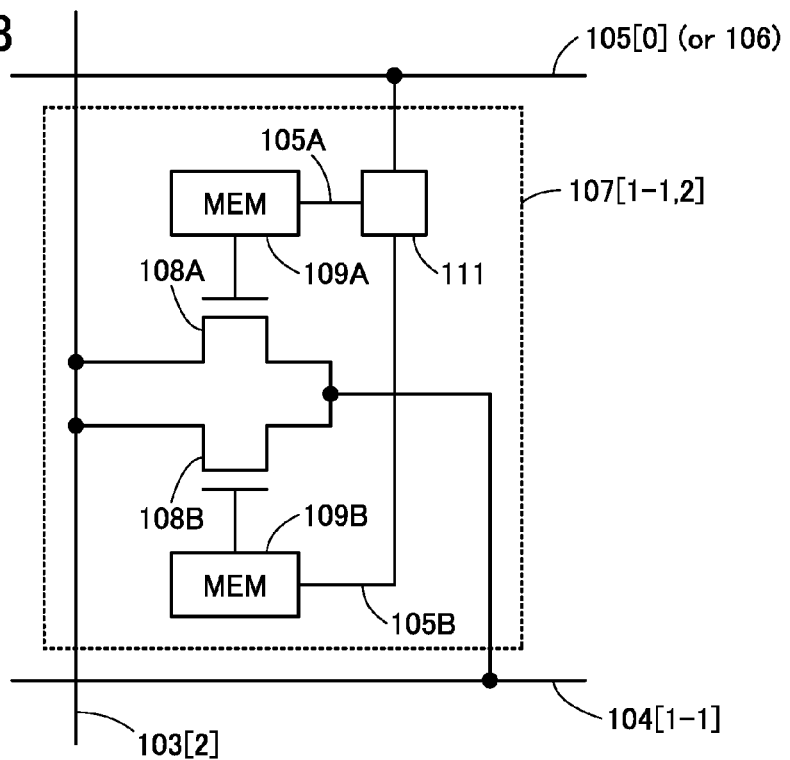

FIG. 7B illustrates another variation example. In the switch circuit 107[1-1,2] in FIG. 7B, the operation of the memory 109A and the operation of the memory 109B are controlled with output signals of the decoder 111 that are transmitted through the control signal lines 105A and 105B. For example, a signal for enabling the operation of the memory 109A is supplied to the control signal line 105A, and a signal for disabling the operation of the memory 109B is supplied to the control signal line 105B.

The above is the case where a context selection signal is a 1-bit signal; the number of input terminals of the multiplexer in FIG. 6A or FIG. 7A should be increased in the case of employing a context selection signal of two or more bits. Alternatively, in FIG. 6B, FIG. 6C, or FIG. 7B, control signals may be supplied from the decoder 111 through three or more control signal lines to transistors, transfer gates, memories, and the like, the number of which matches the number of control signal lines.

FIG. 8 illustrates an example of a 2-bit context selection signal. Here, the switch circuit 107[1-1,2] includes pass transistors 108A to 108D, memories 109A to 109D, and selection transistors 112A to 112D and is designed such that the pass transistor 108A and the selection transistor 112A are placed in series between the wiring 103[2] and the wiring 104[1-1]. Instead of the selection transistors 112A to 112D, transfer gates or circuits having an equivalent function may be used.

A 2-bit context selection signal transmitted through the wirings 105[0] and 105[1] is decoded by the decoder 111, and potentials that set only one of the control signal lines 105A to 105D to H and the others to L are supplied to the control signal lines 105A to 105D. Only one of the selection transistors 112A to 112D is turned on and the others are turned off in accordance with the potentials of the control signal lines 105A to 105D.

Figure 9A:
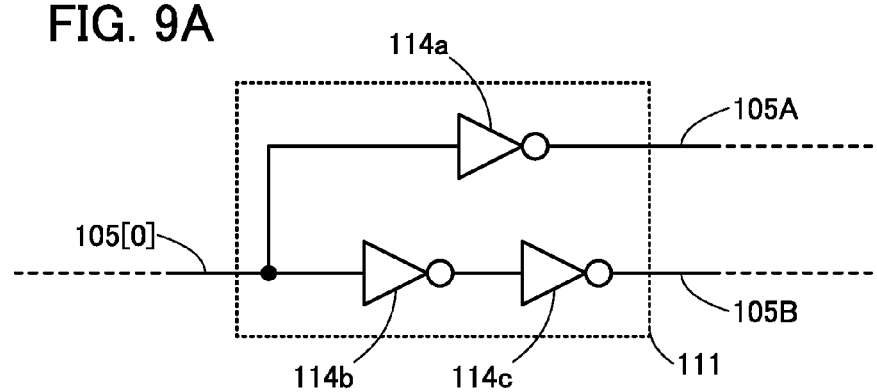
FIGS. 9A to 9C are circuit diagrams each illustrating an example of a decoder.

The decoder 111 includes inverters 114a to 114c as illustrated in FIG. 9A, for example. Note that it is possible not to provide the inverters 114b and 114c. Alternatively, two inverters may be additionally provided in series with the inverter 114a. In other words, any circuit is acceptable as long as the difference between the number of inverters (including 0) provided at a wiring connected to the control signal line 105A and the number of inverters (including 0) provided at a wiring connected to the control signal line 105B is an odd number, subsequent to branch of the wiring 105[0] in the decoder 111. Accordingly, when one of the potentials of the control signal lines 105A and 105B is H, the other becomes L.

Figure 9B:
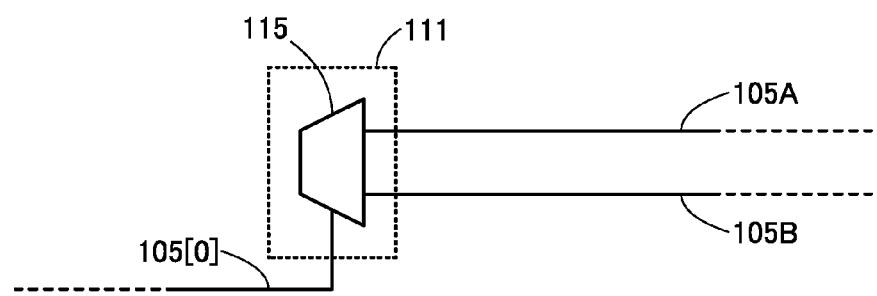
Figure 9C:
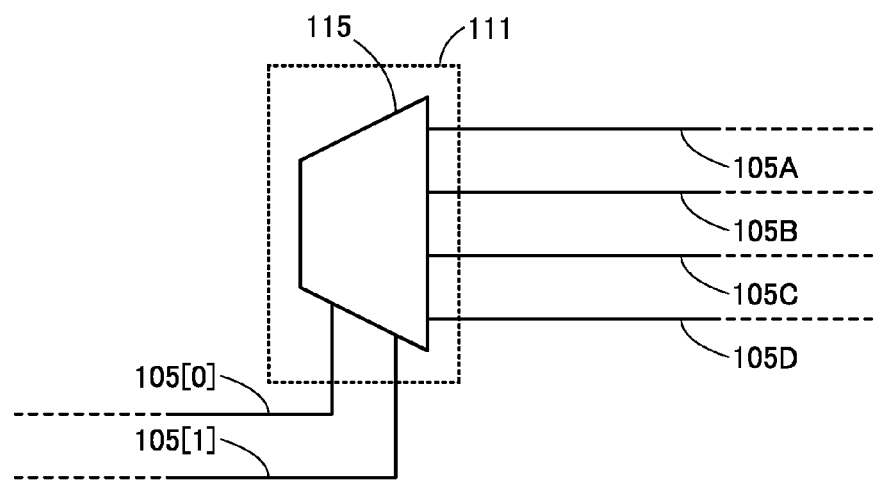

In another example, the decoder 111 includes a 1-input demultiplexer 115 as illustrated in FIG. 9B. The demultiplexer 115 supplies potentials that set one of the control signal lines 105A and 105B to H and the other to L to the control signal lines 105A and 105B in accordance with the potential of the wiring 105[0]. In another example, the decoder 111 includes a 2-input demultiplexer 115 as illustrated in FIG. 9C. The demultiplexer 115 supplies potentials that set only one of the control signal lines 105A to 105D to H and the others to L to the control signal lines 105A to 105D in accordance with the potentials of the wirings 105[0] and 105[1].

Although a context selection signal is input to both the logic element 101 and the switch matrix array 102 in the above examples, it may be input to only one of them. Furthermore, the decoder 111 may be provided in both the logic element 101 and the switch matrix array 102 corresponding to the logic element 101, or may be provided in only one of them while the other is supplied with an output signal of the decoder 111 (a control signal). Alternatively, one decoder 111 may be provided in every two or more logic elements 101 and every two or more switch matrix arrays 102, in which case a control signal may be supplied to the logic elements 101 and the switch matrix arrays 102 where the decoder is not provided.

Next, the logic element 101 will be described. The logic element 101 generally includes at least one lookup table, at least one flip-flop (FF), and at least one multiplexer (MUX). In general, a lookup table includes a memory.

Configuration data is input to the lookup table so that the lookup table functions as a logic gate. In other words, the logic level (e.g., H/L) of a signal output from the lookup table is determined in accordance with the configuration data and the logic level of a signal input to the lookup table.

The signal output from the lookup table is input to the flip-flop. A signal output from the flip-flop included in one logic element 101 may be input to the flip-flop included in another logic element 101. The flip-flop has a function of holding these input signals.

Configuration data is input to the multiplexer to control the operation of the multiplexer. The multiplexer has a function of selecting any one of signals output from the lookup table and the flip-flop in accordance with the configuration data. A signal selected by the multiplexer is output from the logic element 101.

Configuration data with which the lookup table and the multiplexer are controlled can be selected as necessary in accordance with a context selection signal.

Figure 10A:
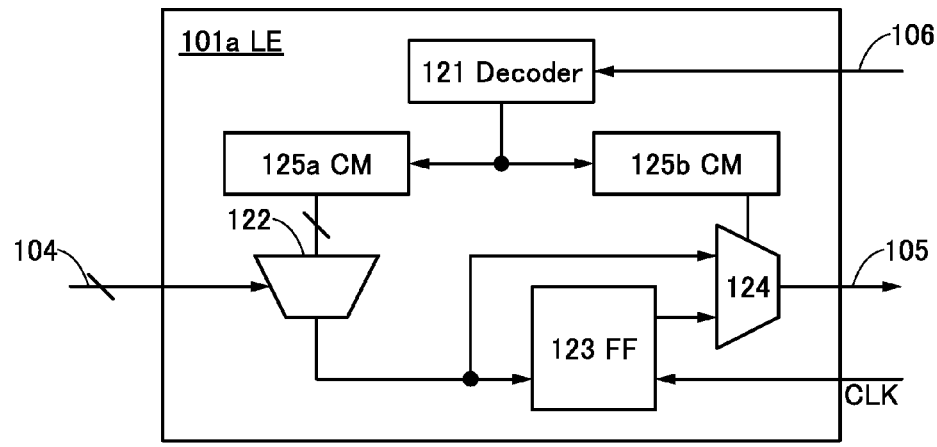
FIGS. 10A and 10B are block diagrams each illustrating a structure example of a logic element.

FIG. 10A illustrates a specific structure example of the logic element 101. A logic element 101a in FIG. 10A includes a decoder 121, a multiplexer 122, a flip-flop 123, a multiplexer 124, a configuration memory 125a that stores configuration memory for the multiplexer 122, and a configuration memory 125b that stores configuration memory for the multiplexer 124. The multiplexer 122 and the configuration memory 125a correspond to the aforementioned lookup table. The decoder 121 is the same as or similar to the decoder 111 shown in FIGS. 9A to 9C.

Logical operation executed in the multiplexer 122 varies in response to configuration data stored in the configuration memory 125a and a context selection signal supplied from the context selection signal line 106. The context selection signal is decoded by the decoder 121. Data loaded to the multiplexers 122 and 124 from the configuration memories 125a and 125b vary in response to an output of the decoder 121.

As a result, the function of the multiplexer 122 can be changed so that the multiplexer 122 operates as an AND gate in one context and as an OR gate in another context, for example.

The multiplexer 122 generates an output signal corresponding to a plurality of input signals supplied from the wirings 104. The flip-flop 123 holds the output signal generated in the multiplexer 122 and outputs an output signal corresponding to the output signal of the multiplexer 122 in synchronization with the clock signal CLK.

Signals output from the multiplexer 122 and the flip-flop 123 are input to the multiplexer 124. The multiplexer 124 has a function of selecting and outputting one of these two output signals in accordance with configuration data stored in the configuration memory 125b and a context selection signal. The signal output from the multiplexer 124 is supplied to the wiring 105.

Figure 10B:
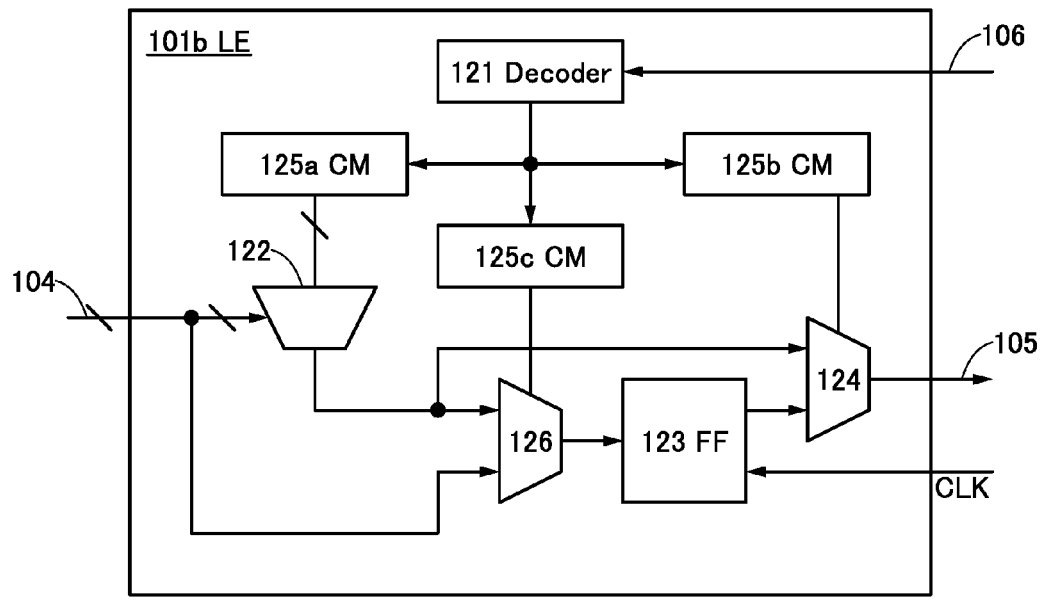

FIG. 10B illustrates another specific structure example of the logic element 101. A logic element 101b of FIG. 10B differs from the logic element 101a of FIG. 10A in including a multiplexer 126 and a configuration memory 125c that stores configuration data for the multiplexer 126.

To the multiplexer 126, a signal output from the multiplexer 122 and a signal output from another logic element 101 (supplied from the wiring 104) are input. The multiplexer 126 has a function of selecting and outputting one of these two signals in accordance with configuration data stored in the configuration memory 125c.

In the logic element 101b in FIG. 10B, the flip-flop 123 holds the signal output from the multiplexer 126 and outputs an output signal corresponding to the signal output from the multiplexer 126 in synchronization with the clock signal CLK.

FIG. 11A illustrates an example of the logic element 101 used in the logic block 100d shown in FIG. 4. A logic element 101c in FIG. 11A is based on the logic element 101a in FIG. 10A. In the logic element 101c of FIG. 11A, an output of the multiplexer 124 is output to the wiring 105 or a 2-input multiplexer 128 through a 2-output demultiplexer 127. As the demultiplexer 127, a circuit equivalent to the multiplexer 110 illustrated in FIG. 6B or FIG. 6C may be used.

Among three terminals (terminals a, b, and c) of the multiplexer 128, a constant potential is assumed to be output to one of the terminals a and b that is not connected to the terminal c. For example, when a method of switching two contexts (using a 1-bit context selection signal) is employed and an initial context selection signal is L, the constant potential may be L. Similarly, the potential L may be supplied to the terminal that is not selected in the demultiplexer 127.

When the logic element 101c generates a context selection signal, an output of the multiplexer 124 (the context selection signal) is output to the context selection signal line 106 through the demultiplexer 127 and the multiplexer 128. That is, the terminal b and the terminal c are connected in this case. The terminal a is supplied with the potential L because it is not connected to the terminal c. An output of the terminal a is decoded by the decoder 121, and the logic element 101c is maintained in an initial context.

When the logic element 101c does not generate a context selection signal, an output of the multiplexer 124 is output to the wiring 105 through the demultiplexer 127. A context selection signal is input to the decoder 121 through the context selection signal line 106 and the multiplexer 128. That is, the terminal a and the terminal c are connected in this case. The terminal b is supplied with the potential L because it is not connected to the terminal c.

The operation of the demultiplexer 127 and the operation of the multiplexer 128 are set by configuration data stored in the configuration memory 125d and the configuration memory 125e, respectively.

The multiplexer 128 determines which of the decoder 121 and the output terminal of the demultiplexer 127 the context selection signal line 106 is connected to. Here, when the context selection signal line 106 is connected to the decoder 121, the logic element 101c can receive a context selection signal. In contrast, when the context selection signal line 106 is connected to the output terminal of the demultiplexer 127, the logic element 101c can output a context selection signal.

Note that when the logic element 101c has only either a state of receiving a context selection signal or a state of outputting a context selection signal, configuration data stored in the configuration memory 125d and that stored in the configuration memory 125e are substantially the same (i.e., one is exactly the same as or exactly opposite to the other). Thus, one configuration memory (and a circuit for inverting an output of the memory, if necessary) can be used as an alternative to the configuration memories 125d and 125e.

Even if an output of the multiplexer 124 is a context selection signal and the context selection signal is supplied to the wiring 105, a switch placed beyond the wiring 105 (a switch in the switch matrix array) can prevent the context selection signal from being taken by another logic element. In that case, the demultiplexer 127 is unnecessary.

FIG. 11B illustrates an example of a logic element with such a structure. A logic element 101d illustrated in FIG. 11B includes a tri-state buffer 129 (or a circuit having a function equivalent to that of a tri-state buffer) and a logic gate 130. Two signals are input to the logic gate 130. The logic gate 130 is equivalent to an AND gate where a signal without being processed is input to a first input and an inverted signal is input to a second input. That is, the logic gate 130 is also equivalent to a NOR gate where an inverted signal is input to a first input and a signal without being processed is input to a second input.

In the logic element 101d, an output of the multiplexer 124 is supplied to the tri-state buffer 129 in addition to the wiring 105. An output of the tri-state buffer 129 is supplied to the context selection signal line 106 and one of the inputs of the logic gate 130. An output of the configuration memory 125d is input to the other of the inputs of the logic gate 130.

The tri-state buffer 129 is controlled by the configuration memory 125d, and is turned on when the output of the configuration memory 125d is H and is turned off when the output of the configuration memory 125d is L. It is assumed here that the output of the configuration memory 125d is H when the logic element 101d generates a context selection signal, and is L when the logic element 101d does not.

For example, when the output of the configuration memory 125d is H, the tri-state buffer 129 is on, so that the output of the multiplexer 124 (context selection signal) is supplied to the wiring 105, the context selection signal line 106, and the one of the inputs of the logic gate 130. Although it is not known whether the output of the tri-state buffer 129 is H or L, the logic gate 130 outputs L all the time because H is input to the other of the inputs of the logic gate 130. Thus, the context is not changed in accordance with the output of the tri-state buffer 129.

For example, when the output of the configuration memory 125d is L, the tri-state buffer 129 is off, whereby the output of the multiplexer 124 is supplied only to the wiring 105. A context selection signal is input from another logic element to the one of the inputs of the logic gate 130 through the context selection signal line 106. The output (L) of the configuration memory 125d is supplied to the other of the inputs of the logic gate 130, so that the logic gate 130 outputs H when the potential of the context selection signal line 106 is H and outputs L when the potential of the context selection signal line 106 is L.

The functions of the configuration memory 125d, the tri-state buffer 129, and the logic gate 130 in FIG. 11B can be achieved by other logic gates. For example, it is possible to employ a logic gate which has first to fourth terminals and in which the first terminal and the third terminal are connected to the second terminal and the fourth terminal, respectively, in a first state, and the first terminal is connected to the fourth terminal and the second and third terminals are not connected to any other terminal in a second state. In this case, for example, the first terminal is connected to the input of the decoder 121, the third terminal is connected to the output of the multiplexer 124, the potential of the second terminal is set L, and the fourth terminal is connected to the context selection signal line 106.

In the first state, the potential of the input of the decoder 121 becomes L, and the output of the multiplexer 124 is connected to the context selection signal line 106. In the second state, the context selection signal line 106 is connected to the input of the decoder 121. The output of the multiplexer 124 is not connected to the second terminal or the fourth terminal. Meanwhile, the output of the multiplexer 124 is connected to the wiring 105 in both the first state and the second state.

In other words, in the first state, a context selection signal generated in the logic element can be supplied to the context selection signal line 106, whereas in the second state, the logic element can receive a context selection signal generated in another logic element, change a context, and output an arithmetic result to the wiring 105.

Note that in the logic element 101 illustrated in FIGS. 10A and 10B and FIGS. 11A and 11B, the type of flip-flop 123 to be used is determined by configuration data. Specifically, the flip-flop 123 is any of a D flip-flop, a T flip-flop, a JK flip-flop, and an RS flip-flop, as determined by configuration data.

An electronic device includes a combination of one kind or two or more kinds of the aforementioned logic blocks 100a to 100d and components having a function equivalent to these (referred to as logic blocks 100). In an example illustrated in FIG. 12, output signals of a logic block 100[0] are supplied to the wirings 103[0] to 103[7]. Signals transmitted through the wirings 103[0] to 103[7] are supplied to a logic block 100[1]. Output signals of the logic block 100[1] are supplied to wirings 103[8] to 103[15]. Signals transmitted through the wirings 103[8] to 103[15] are supplied to a logic block 100[2]. Output signals of the logic block 100[2] are supplied to wirings 103[16] to 103[23]. Signals transmitted through the wirings 103[16] to 103[23] are supplied to a logic block 100[3].

An example of driving an electronic device having a structure such as one illustrated in FIG. 12 will be described. It is assumed that the logic block 100[0] supplies a potential for generating a context selection signal to the wirings 103[0] and 103[1] and supplies data used for arithmetic to the wirings 103[2] to 103[7]. For example, the logic block 100[0] has a function of analyzing a serial signal stream, finding a header, and extracting 2-bit data (context determination data) for generating a context selection signal, which is placed right after the header. Then, a potential corresponding to the context determination data is supplied to the wirings 103[0] and 103[1]. Moreover, the logic block 100[0] supplies 6-bit data following the context determination data to the wirings 103[2] to 103[7]. The context determination data is a combination of H and L as above.

The logic block 100[1] generates a context selection signal on the basis of the potentials of the wirings 103[0] and 103[1], and the context in the logic block 100[1] is changed. Then, arithmetic is performed based on the potentials of the wirings 103[2] to 103[7], and the arithmetic result is output to the wirings 103[8] to 103[15]. Here, the arithmetic result is composed of 2-bit context determination data and 6-bit data used for the next arithmetic; the context determination data is output to the wirings 103[8] and 103[9], and the other data is output to the wirings 103[10] to 103[15]. With one arithmetic result containing context determination data as described above, the context is changed in the next logic block and different arithmetic is executed. In this example, when the output of the logic block 100[1] is changed, the context is changed accordingly.

Figure 13:
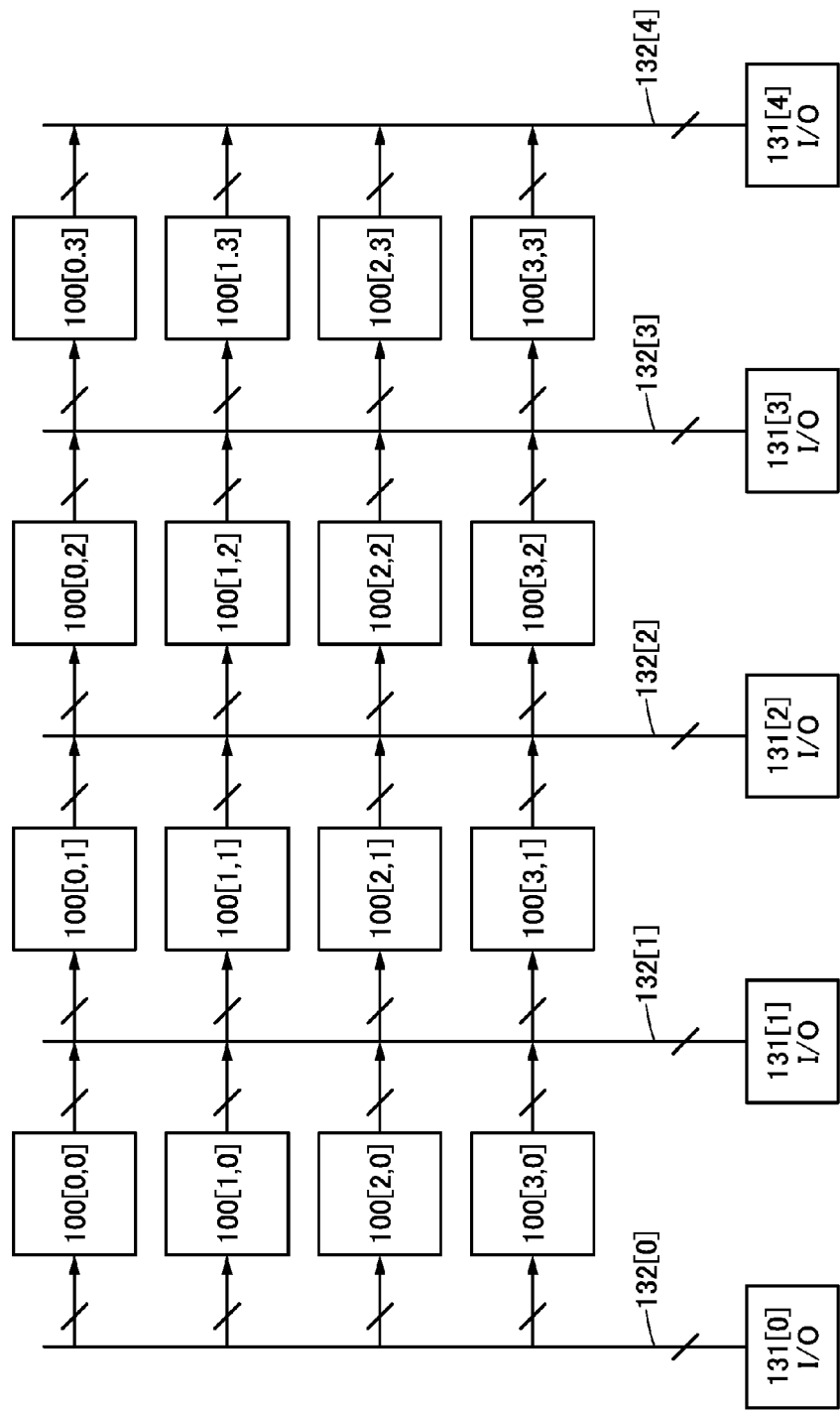
FIG. 13 is a block diagram illustrating an example of an electronic device.

FIG. 13 illustrates another example. In an electronic device illustrated in FIG. 13, logic blocks 100 are arranged in a matrix. For example, a logic block 100[0,0] is supplied with a signal from a wiring group 132[0] and outputs the signal to a wiring group 132[1]. Moreover, the wiring group 132[0] is supplied with a signal from an input/output circuit 131[0]. The wiring group 132 is composed of a plurality of wirings 103. Here, one wiring group 132 is composed of 32 wirings 103 (i.e., the wiring group 132 is 32 bits), and one logic block 100 can output 8-bit data (i.e., there are eight wirings 105 to output data from one logic block 100 to the outside).

For example, a serial signal stream is sequentially input to the wiring group 132[0] from the input/output circuit 131[0]. The signal stream is assumed to contain a 6- to 32-bit header, 2-bit context determination data following the header, and 16- to 30-bit data used for arithmetic. The number of bits of the header and data may be variable in this way.

Eight logic blocks 100 on the left, i.e., logic blocks 100[0,0] to 100[3,1] find the header and supply context determination data following the header (first context determination data) and data used for arithmetic to a wiring group 132[2].

In logic blocks 100[0,2] to 100[3,2], a context to be used is determined based on the first context determination data, and arithmetic is executed using the context and the data used for arithmetic. Here, to the wiring group 132[3], the logic blocks 100[0,2] to 100[2,2] supply 2-bit second context determination data and 16-bit data, and the logic block 100[3,2] supplies 2-bit third context determination data and 4-bit data. In addition to these, an input/output circuit 131[3] supplies 8-bit data to the wiring group 132[3].

For example, the wiring group 132[3] is composed of wirings 103[3-0] to 103[3-31]. Here, the logic block 100[0,2], the logic block 100[1,2], the logic block 100[2,2], and the logic block 100[3,2] can output signals to the wirings 103[3-0] to 103[3-7], the wirings 103[3-8] to 103[3-15], the wirings 103[3-16] to 103[3-23], and the wirings 103[3-24] to 103[3-31], respectively. The input/output circuit 131[3] can supply signals to all the wirings 103[3-0] to 103[3-31].

Moreover, the second context determination data is supplied to the wirings 103[3-0] and 103[3-1]; the 16-bit data, to the wirings 103[3-2] to 103[3-17]; the third context determination data, to the wirings 103[3-26] and 103[3-27]; the 4-bit data, to the wirings 103[3-28] to 103[3-31]; the 8-bit data supplied from the input/output circuit 131[3], to the wirings 103[3-18] to 103[3-25].

Each of the logic blocks 100[0,3] to 100[2,3] reads the second context determination data from two wirings (the wirings 103[3-0] and 103[3-1]) in the wiring group 132[3], and executes a first context with the use of data accompanying the second context determination data. In other words, in order that the second context determination data is supplied to the logic elements 101 that generate a context selection signal in each of the logic blocks 100[0,3] to 100[2,3] (the total number of such logic elements 101 in these logic blocks 100 is three), each of the corresponding switch matrix arrays 102 is set so that the wirings 103[3-0] and 103[3-1] are electrically connected to the logic element 101 generating a context selection signal.

Note that the data used for arithmetic is 16-bit data supplied from the logic blocks 100[0,2] to 100[2,2] and part of 8-bit data (e.g., 4-bit data) supplied from the input/output circuit 131[3].

Meanwhile, the logic block 100[3,3] reads the third context determination data from two other wirings (the wirings 103[3-26] and 103[3-27]) in the wiring group 132[3], and executes a second context with the use of data accompanying the third context determination data. In such a manner, different contexts are implemented at the same time in different regions of one electronic device. A region that implements a context can be set by a user.

In another example, the logic block 100[0,2] can supply the second and third context determination data. In this case, the second and third context determination data are supplied to any of the wirings 103[3-0] to 103[3-7].

In the above explanation, the first, second, and third context determination data are independent of one another. For example, the first and second context determination data are not always the same or not always different from each other. When the first context determination data is given 2-bit data, the second context determination data is not necessarily specific 2-bit data. The same applies to the first and third context determination data. Context selection signals that are obtained from these context determination data and output from the logic elements 101 are independent of one another.

For example, the second and third context determination data reflect the results of arithmetic performed in the logic blocks 100[0,2] to 100[3,2].

Figure 12:
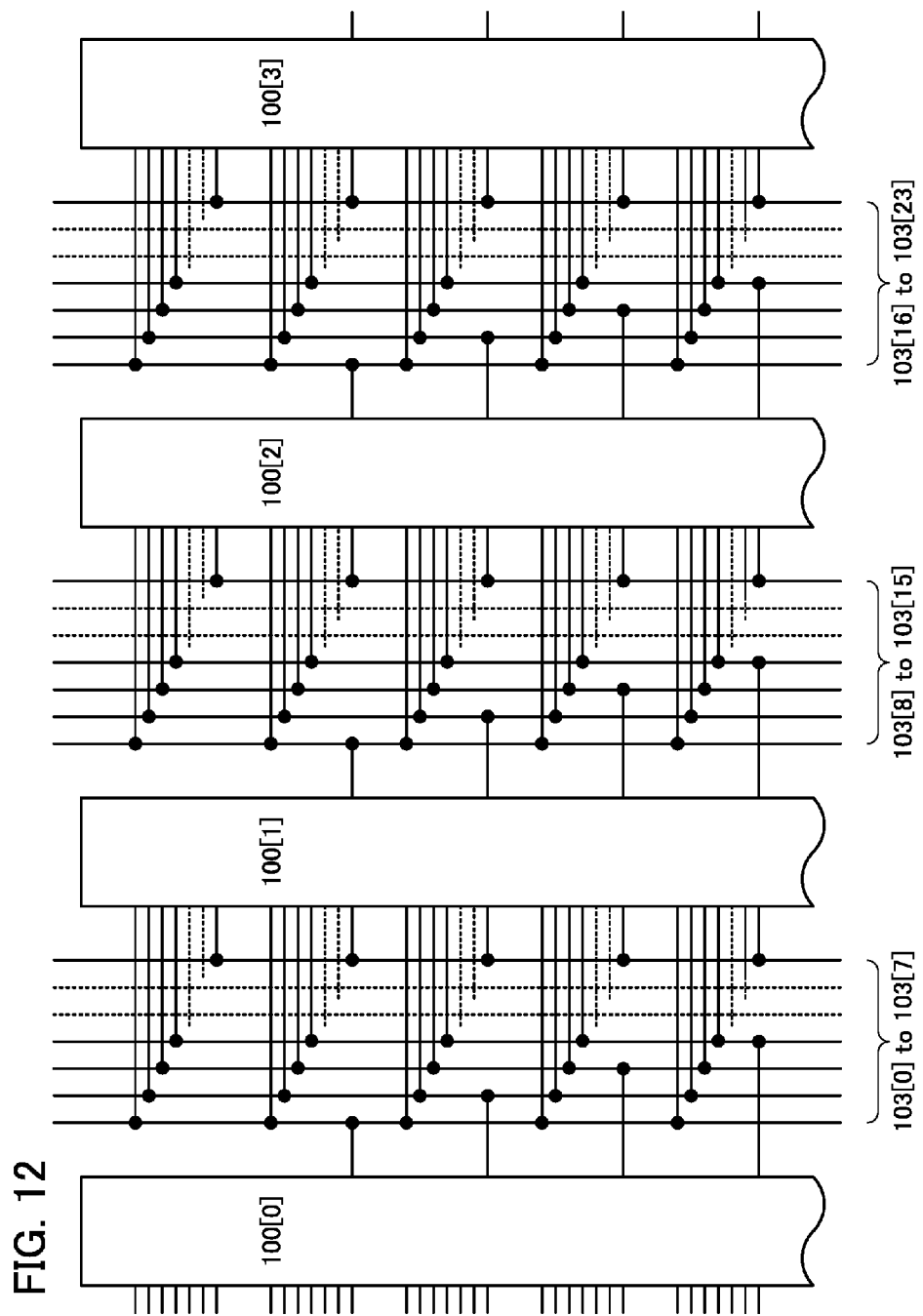
FIG. 12 is a block diagram illustrating an example of an electronic device.

In the logic block 100 illustrated in FIG. 12, a signal is input from the left side and output to the right side. Alternatively, some of the outputs of the logic block 100 may be output to the left side. For example, some of the outputs of the logic block 100[1] may be output to (some of) the wirings 103[8] to 103[15] and the others may be output to (some of) the wirings 103[0] to 103[7]. Thus, a logic structure can be constituted more flexibly.

Figure 14:
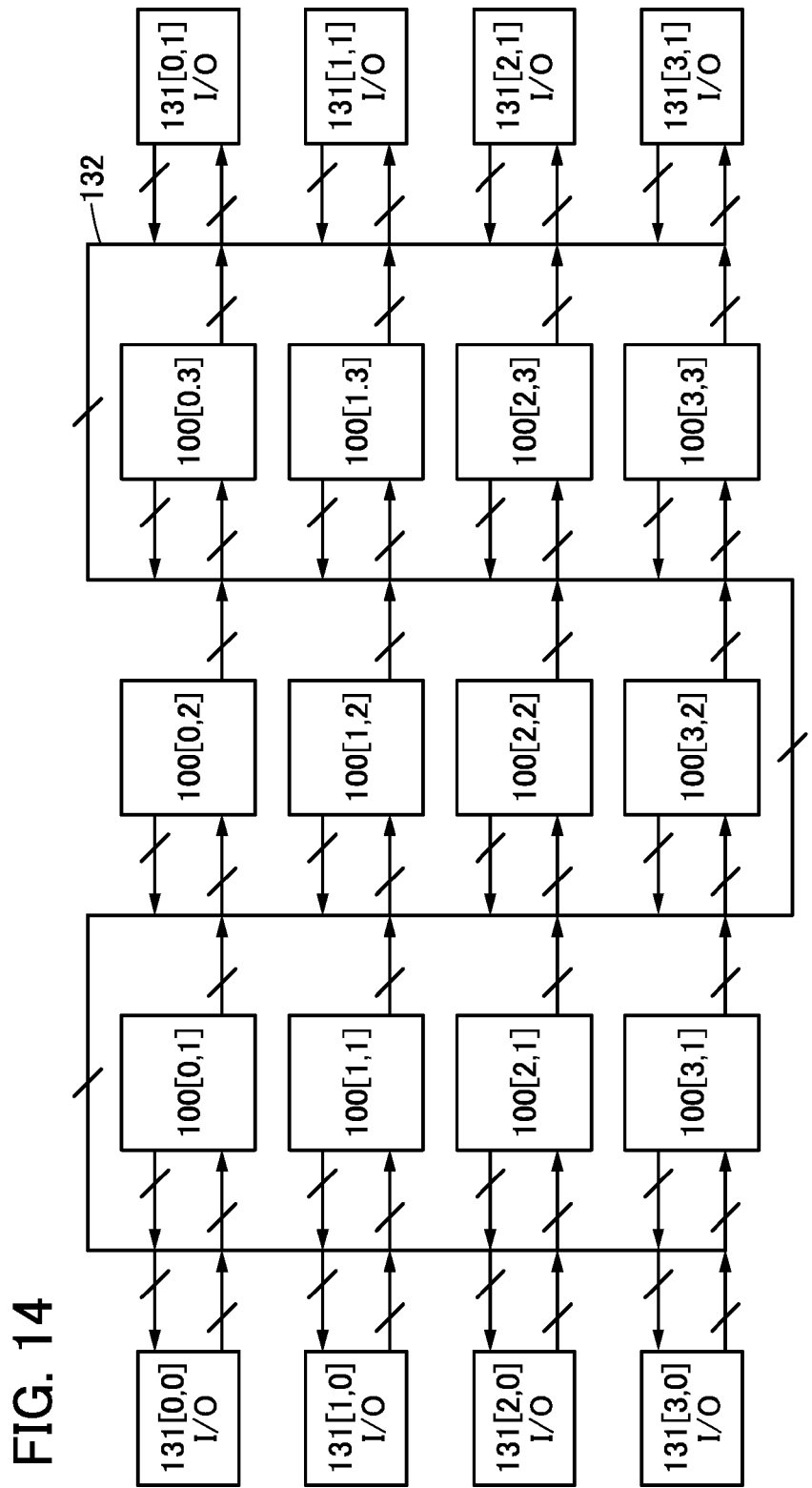
FIG. 14 is a block diagram illustrating an example of an electronic device.

FIG. 14 illustrates an example of an electronic device using the logic block 100 with the above structure. In FIG. 14, the logic blocks 100 and the input/output circuits 131 are arranged in a matrix, and the wiring group 132 is placed therebetween so as to meander. The wiring group 132 may include wirings with various lengths. Patent Document 2 can be referred to for the details.

Figure 15:
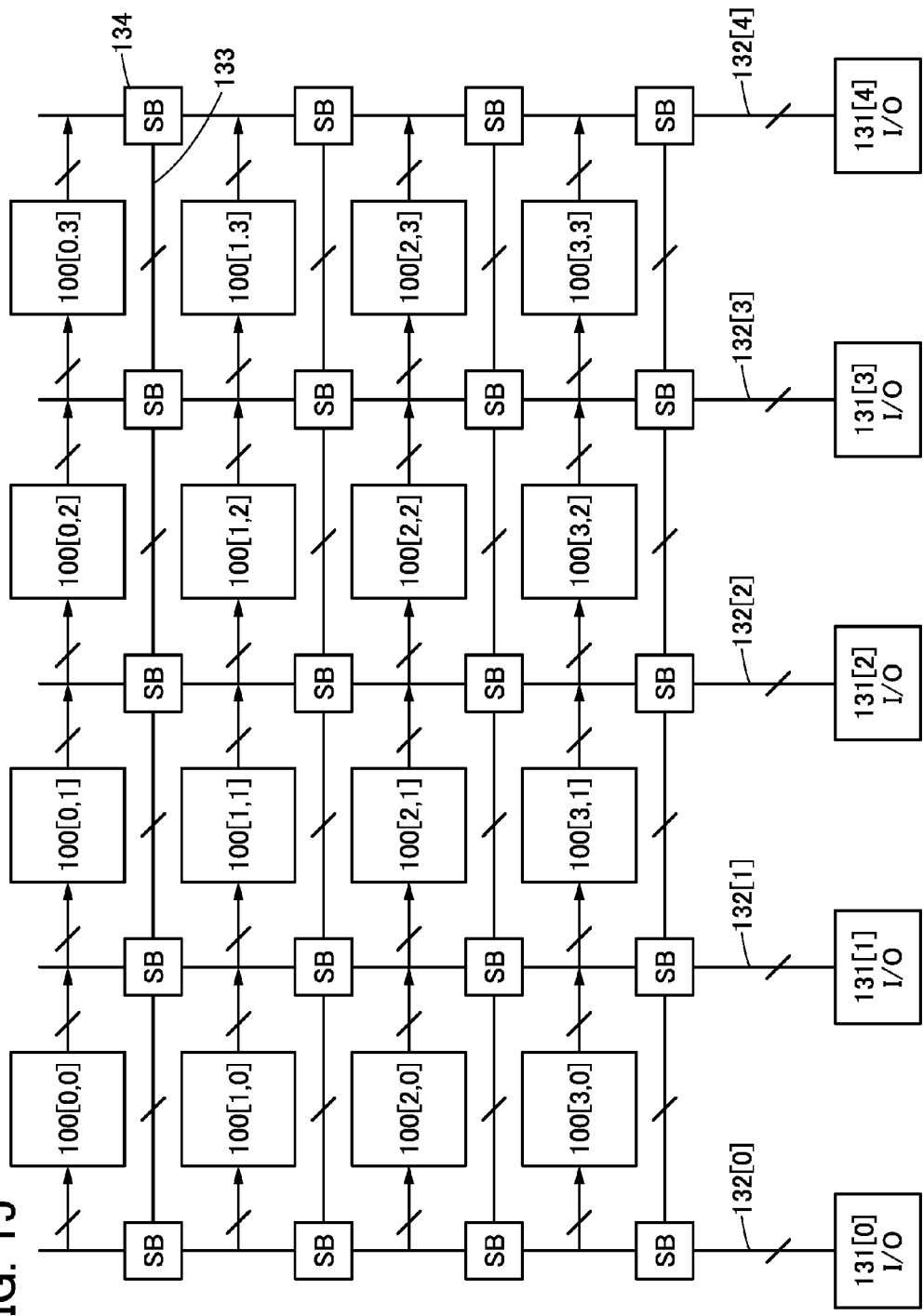
FIG. 15 is a block diagram illustrating an example of an electronic device.

FIG. 15 illustrates another example of an electronic device. The electronic device illustrated in FIG. 15 includes wiring groups 133 capable of connecting the wiring groups 132, and switch blocks 134 at intersections of the wiring groups 132 and the wiring groups 133 in addition to the components of the electronic device in FIG. 13. Accordingly, an output of a logic block 100[M,X] can be input to a logic block 100[N,Y], resulting in higher use efficiency of the routing resource (note that X is larger than Y and each of M and N is one of 0, 1, 2, and 3).

Figure 16A:
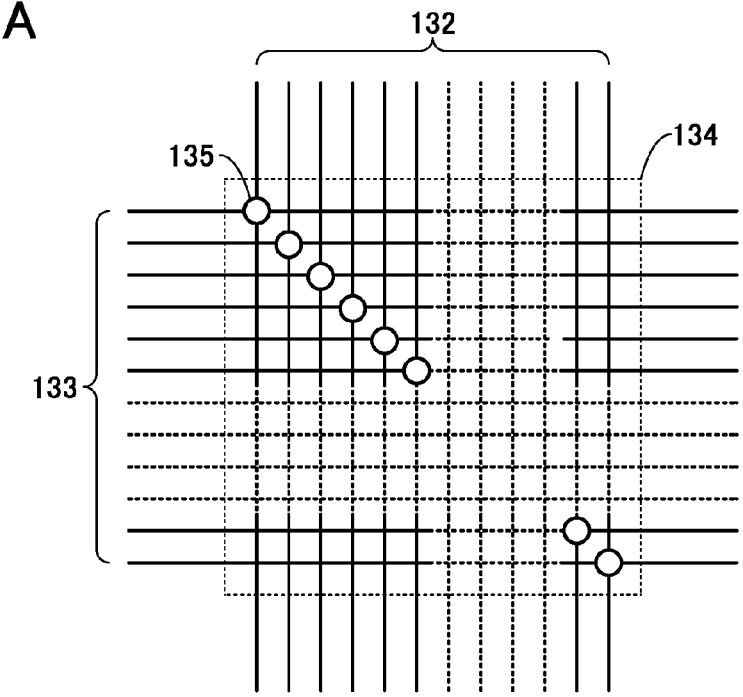
FIGS. 16A and 16B are diagrams illustrating an example of a switch block.
Figure 16B:
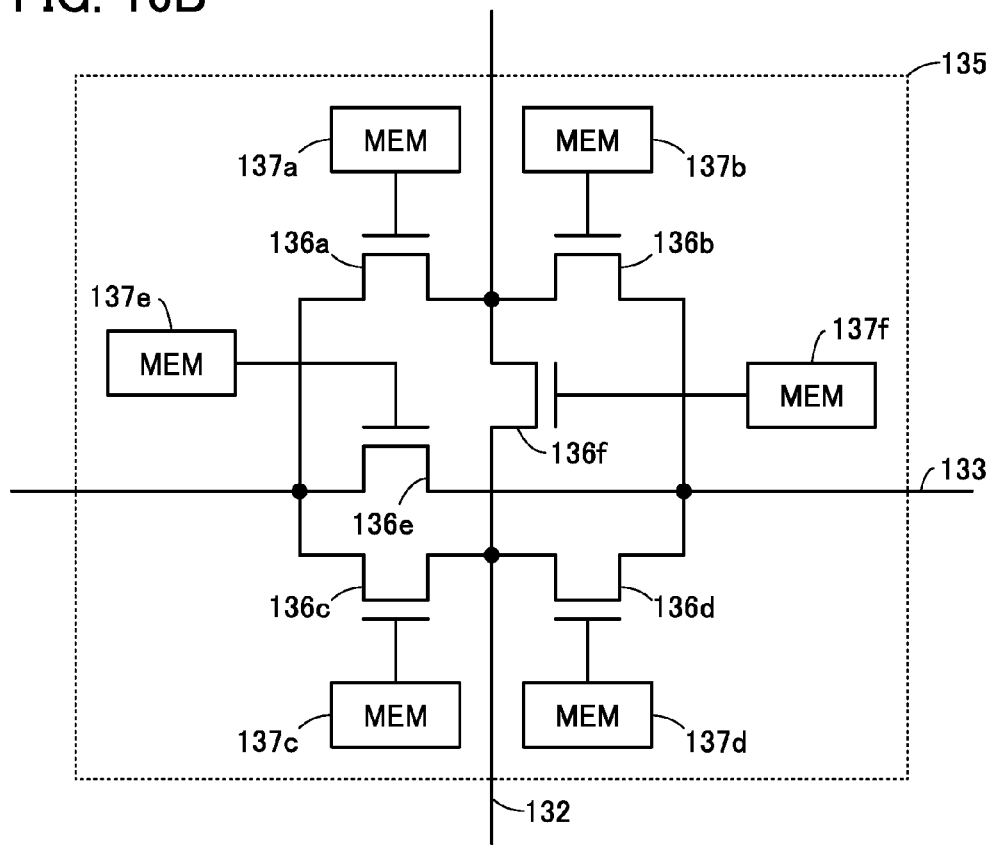

The switch block 134 includes a plurality of cross switch elements 135 as illustrated in FIG. 16A, for example. One cross switch element 135 includes switches 136a to 136f and memories 137a to 137f for controlling the operation of the corresponding switch, as illustrated in FIG. 16B, for example. Each of the switches 136a to 136f has a function of connecting or disconnecting two corresponding wirings.

Although the cross switch element 135 illustrated in FIG. 16B includes only one switch between two wirings, a cross switch element may include a plurality of switches (and memories corresponding to the switches) between two wirings so that multi-context driving is possible. Furthermore, a context selection signal for each switch block 134 may be supplied from any of the adjacent logic blocks 100.

In the above manner, a context selection signal can be locally generated in an electronic device including a reconfigurable circuit capable of executing multi-context operation. As described above, a context selection signal is generated in the reconfigurable circuit with the use of context determination data contained in an output of another logic block, for example. The range of application of the context selection signal can be set as appropriate by a user. Thus, multi-context operation performed locally and partly enables efficient use of the circuit. Moreover, memory usage can be reduced compared to the case of using global multi-context driving.

Embodiment 2

In this embodiment, an example of a cross-sectional structure of transistors disclosed herein will be described with reference to drawings.

FIG. 17 illustrates part of a cross-sectional structure. A cross section along the dashed line A1-A2 shows a structure of a transistor 241 and a transistor 242 in the channel length direction, and a cross section along the dashed line A3-A4 shows a structure of the transistor 241 and the transistor 242 in the channel width direction. Note that in one embodiment of the present invention, the channel length direction of the transistor 241 is not necessarily the same as the channel length direction of the transistor 242.

In FIG. 17, the transistor 241 including a channel formation region in a metal oxide film exhibiting semiconductor characteristics is formed over the transistor 242 including a channel formation region in a single crystal silicon substrate.

The transistor 242 may include the channel formation region in a semiconductor film or a semiconductor substrate of silicon, germanium, or the like in an amorphous, microcrystalline, polycrystalline, or single crystal state. Alternatively, the transistor 242 may include the channel formation region in a metal oxide film or a metal oxide substrate that exhibits semiconductor characteristics. When each of the transistors includes a channel formation region in a metal oxide film or a metal oxide substrate, the transistor 241 is not necessarily stacked over the transistor 242, and the transistor 241 and the transistor 242 may be formed in the same layer.

When the transistor 242 is formed using a thin silicon film, any of the following can be used, for example: amorphous silicon formed by sputtering or vapor phase growth such as plasma-enhanced CVD; polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

A substrate 200 where the transistor 242 is formed can be, for example, a silicon substrate, a germanium substrate, or a silicon germanium substrate. In FIG. 17, a single crystal silicon substrate is used as the substrate 200.

The transistor 242 is electrically isolated by an element isolation method. As the element isolation method, a trench isolation method (shallow trench isolation (STI) method) or the like can be used. FIG. 17 illustrates an example where the trench isolation method is used to electrically isolate the transistor 242. Specifically, in FIG. 17, the transistor 242 is electrically isolated by element isolation using an element isolation region 201 formed in such a manner that an insulator containing silicon oxide or the like is buried in a trench formed in the substrate 200 by etching or the like and then the insulator is partly removed by etching or the like.

On a projection of the substrate 200 in a region other than the trench, impurity regions 202 and 203 of the transistor 242 and a channel formation region 204 positioned between the impurity regions 202 and 203 are provided. Moreover, the transistor 242 includes an insulating film 205 covering the channel formation region 204 and a gate electrode 206 that overlaps the channel formation region 204 with the insulating film 205 placed therebetween.

In the transistor 242, the gate electrode 206 overlaps a side portion and an upper portion of the projection in the channel formation region 204 with the insulating film 205 positioned therebetween, so that carriers flow in a wide area (including a side portion and an upper portion of the channel formation region 204). Thus, the number of carriers transferred in the transistor 242 can be increased while an area over the substrate occupied by the transistor 242 is reduced. As a result, the on-state current and field-effect mobility of the transistor 242 are increased. Suppose the length in the channel width direction (channel width) of the projection in the channel formation region 204 is W, and the thickness of the projection in the channel formation region 204 is T. When the aspect ratio of the thickness T to the channel width W is high, a region where carriers flow becomes larger. Thus, the on-state current and field-effect mobility of the transistor 242 can be further increased.

When the transistors 242 is formed using a bulk semiconductor substrate, the aspect ratio is preferably 0.5 or more, further preferably 1 or more.

An insulating film 211 is provided over the transistor 242. Openings are formed in the insulating film 211. A conductive film 212 electrically connected to the impurity regions 202, a conductive film 213 electrically connected to the impurity region 203, and a conductive film 214 electrically connected to the gate electrode 206 are formed in the openings.

The conductive film 212 is electrically connected to a conductive film 216 formed over the insulating film 211. The conductive film 213 is electrically connected to a conductive film 217 formed over the insulating film 211. The conductive film 214 is electrically connected to a conductive film 218 formed over the insulating film 211.

An insulating film 220 is provided over the conductive films 216 to 218. An insulating film 221 having an effect of blocking diffusion of oxygen, hydrogen, and water is provided over the insulating film 220. As the insulating film 221 has higher density and is denser or has a fewer dangling bonds and is more chemically stable, the insulating film 221 has a higher blocking effect. The insulating film 221 having an effect of blocking diffusion of oxygen, hydrogen, and water can be formed using aluminum oxide, aluminum oxynitride, gallium oxide, gallium oxynitride, yttrium oxide, yttrium oxynitride, hafnium oxide, or hafnium oxynitride, for example. The insulating film 221 having an effect of blocking diffusion of hydrogen and water can be formed using silicon nitride or silicon nitride oxide, for example.

An insulating film 222 is provided over the insulating film 221. The transistor 241 is provided over the insulating film 222.

The transistor 241 includes, over the insulating film 222, a metal oxide film 230 exhibiting semiconductor characteristics, conductive films 232 and 233 that are electrically connected to the metal oxide film 230 and function as source and drain electrodes, a gate insulating film 231 covering the metal oxide film 230, and a gate electrode 234 overlapping the metal oxide film 230 with the gate insulating film 231 positioned therebetween. An opening is formed in the insulating films 220 to 222. The conductive film 233 is connected to the conductive film 218 in the opening.

Note that in FIG. 17, the transistor 241 includes at least the gate electrode 234 on one side of the metal oxide film 230, and may also include a gate electrode that overlaps with the metal oxide film 230 with the insulating film 222 positioned therebetween.

When the transistor 241 has a pair of gate electrodes, one of the gate electrodes may be supplied with a signal for controlling the on/off state, and the other of the gate electrodes may be supplied with a potential from another wiring. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In FIG. 17, the transistor 241 has a single-gate structure where one channel formation region corresponding to one gate electrode 234 is provided. Alternatively, the transistor 241 may have a multi-gate structure where a plurality of electrically connected gate electrodes are provided so that a plurality of channel formation regions are included in one active layer.

FIG. 17 illustrates an example where the metal oxide film 230 in the transistor 241 includes metal oxide films 230a to 230c that are stacked in this order over the insulating film 222. Note that in one embodiment of the present invention, the metal oxide film 230 in the transistor 241 may be formed using a single-layer metal oxide film. When the transistor 241 has a layered structure as illustrated in FIG. 17, the metal oxide films 230a and 230c do not necessarily function as a semiconductor; i.e., it is acceptable as long as the metal oxide film 230b functions as a semiconductor.

The insulating film 222 preferably has a function of supplying part of oxygen contained therein to the metal oxide films 230a to 230c by heating. It is preferred that the number of defects in the insulating film 222 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The insulating film 222, which has a function of supplying part of the oxygen to the metal oxide films 230a to 230c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 222 can be formed by a plasma-enhanced chemical vapor deposition (CVD) method, a sputtering method, or the like.

Note that in this specification, oxynitride contains more oxygen than nitrogen, and nitride oxide contains more nitrogen than oxygen.

In the transistor 241 in FIG. 17, the gate electrode 234 overlaps end portions of the metal oxide film 230b (where a channel region is formed) that do not overlap with the conductive films 232 and 233, i.e., end portions of the metal oxide film 230b that are in a region different from a region where the conductive films 232 and 233 are located. When the end portion of the metal oxide film 230b is exposed to plasma by etching for forming the end portion, a chlorine radical, a fluorine radical, or the like generated from an etching gas is easily bonded to a metal element contained in the metal oxide. For this reason, in the end portion of the metal oxide film, oxygen bonded to the metal element is easily released, so that an oxygen vacancy is easily formed; thus, the metal oxide film easily has n-type conductivity. However, in the transistor 241 of FIG. 17, electric fields applied to the end portions can be controlled by controlling the potential of the gate electrode 234 because the end portions of the metal oxide film 230b that do not overlap with the conductive films 232 and 233 overlap with the gate electrode 234. Consequently, current that flows between the conductive films 232 and 233 through the end portions of the metal oxide film 230b can be controlled by the potential applied to the gate electrode 234. Such a structure of the transistor 241 is referred to as a surrounded channel (s-channel) structure.

With the s-channel structure, when a potential at which the transistor 241 is turned off is supplied to the gate electrode 234, the amount of off-state current that flows between the conductive films 232 and 233 through the end portions of the metal oxide film 230b can be reduced. For this reason, even when the distance between the conductive films 232 and 233 at the end portions of the metal oxide film 230b is reduced in the transistor 241 as a result of decreasing the channel length to obtain high on-state current, the transistor 241 can have low off-state current. Consequently, with a short channel length, the transistor 241 can have high on-state current and low off-state current.

With the s-channel structure, when a potential at which the transistor 241 is turned on is supplied to the gate electrode 234, the amount of current that flows between the conductive films 232 and 233 through the end portions of the metal oxide film 230b can be increased. The current contributes to an increase in the field-effect mobility and on-state current of the transistor 241. When the end portions of the metal oxide film 230b overlap with the gate electrode 234, carriers flow in a wide region of the metal oxide film 230b without being limited to a region in the vicinity of the interface of the metal oxide film 230b close to the gate insulating film 231, which results in an increase in the number of carriers transferred in the transistor 241. As a result, the on-state current and field-effect mobility of the transistor 241 are increased. Typically, the field-effect mobility is increased to 10 cm$^2$/V·s or higher or 20 cm$^2$/V·s or higher. Note that here, the field-effect mobility is not an approximate value of the mobility as the physical property value of a material contained in the metal oxide film 230b but the apparent field-effect mobility in a saturation region of the transistor, which is an index of current drive capability.

Figure 18:
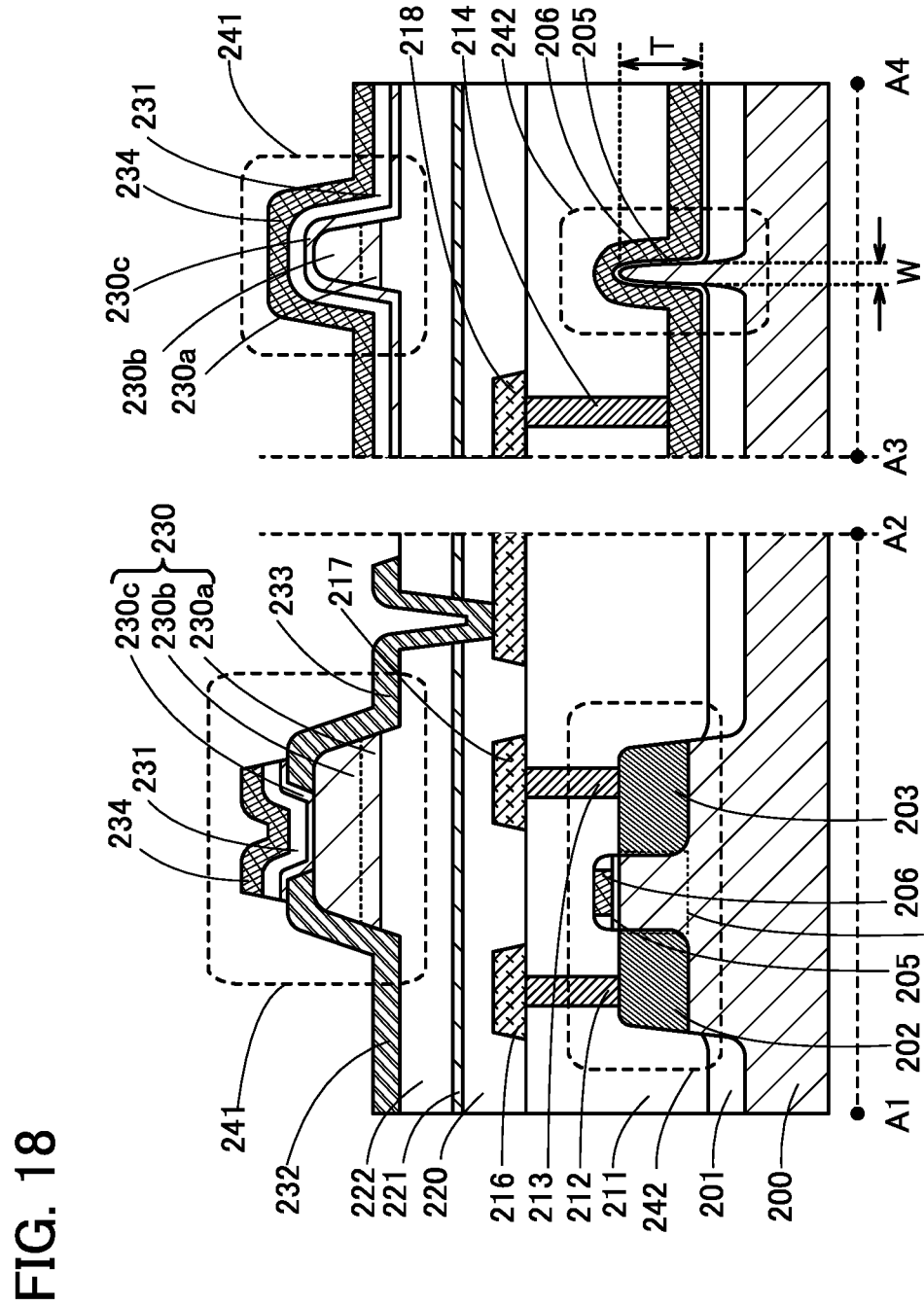
FIG. 18 is a cross-sectional view illustrating a structure example of an electronic device.

In addition, a structure illustrated in FIG. 18 may be employed, for example.

The transistor 241 of FIG. 18 differs from the transistor 241 of FIG. 17 in that the metal oxide film 230c is partly formed over the conductive films 232 and 233. Accordingly, the metal oxide film 230b, which is more characteristic of a semiconductor than the metal oxide film 230c, is in contact with the conductive films 232 and 233; thus, the resistance between the source and the drain can be decreased.

Embodiment 3

In this embodiment, examples of the electronic device described in the foregoing embodiment will be described with reference to FIGS. 19A to 19E.

Figure 19A:
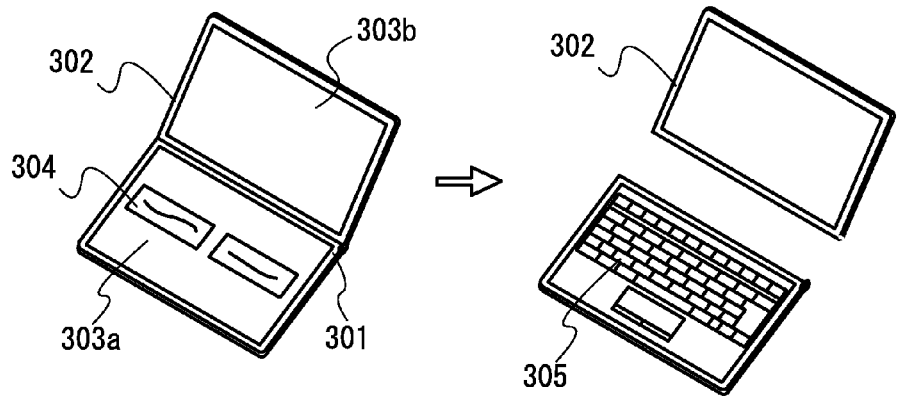
FIGS. 19A to 19E each illustrate a specific example of an electronic device.

FIG. 19A illustrates a portable information appliance that includes a housing 301, a housing 302, a first display portion 303a, a second display portion 303b, and the like. At least one of the housings 301 and 302 is provided with an electronic component including the logic block 100 or the like of the foregoing embodiment, which functions as a reconfigurable circuit. It is thus possible to obtain a low-power portable information appliance with a smaller number of wirings between circuits.

The first display portion 303a is a panel having a touch input function, and for example, as illustrated in the left of FIG. 19A, which of "touch input" and "keyboard input" is performed can be selected by a selection button 304 displayed on the first display portion 303a. Since selection buttons with a variety of sizes can be displayed, the information appliance can be easily used by people of any generation. For example, when "keyboard input" is selected, a keyboard 305 is displayed on the first display portion 303a as illustrated in the right of FIG. 19A. Thus, letters can be input quickly by keyboard input as in a conventional information appliance, for example.

One of the first display portion 303a and the second display portion 303b can be detached from the portable information appliance as shown in the right of FIG. 19A. Providing the second display portion 303b with a touch input function makes the information appliance convenient to carry because a weight to carry around can be further reduced and the information appliance can operate with one hand while the other hand supports the housing 302. When the form of the electronic device is changed in the above manner, the configuration of the logic block 100 or the like can also be changed. For example, arithmetic different from that in the state shown in the left of FIG. 19A may be executed using a multi-context function.

The portable information appliance in FIG. 19A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 19A may transmit and receive data wirelessly. Through wireless communication, desired book data or the like can be purchased and downloaded from an e-book server.

Furthermore, the housing 302 in FIG. 19A may be equipped with an antenna, a microphone function, and a wireless communication function to be used as a mobile phone.

Figure 19B:
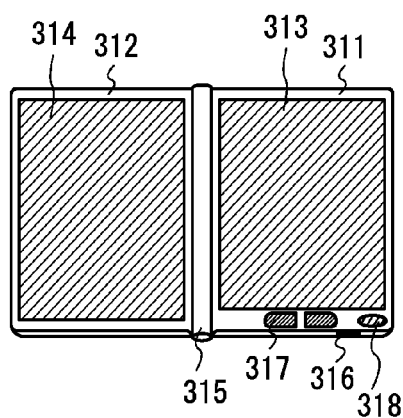

FIG. 19B illustrates an e-book reader including electronic paper. The e-book reader has two housings 311 and 312. The housing 311 and the housing 312 are provided with a display portion 313 and a display portion 314, respectively. The housings 311 and 312 are connected by a hinge 315 and can be opened and closed with the hinge 315 as an axis. The housing 311 is provided with a power switch 316, an operation key 317, a speaker 318, and the like. At least one of the housings 311 and 312 is provided with an electronic component including the logic block 100 or the like of the foregoing embodiment, which functions as a reconfigurable circuit. It is thus possible to obtain a low-power e-book reader with a smaller number of wirings between circuits.

Note that the configuration of the logic block 100 or the like, which is incorporated in the e-book reader, can be changed in accordance with the relative position or angle between the housings 311 and 312. For example, with the use of a multi-context function, the logic block 100 or the like may execute different kinds of arithmetic depending on whether the e-book reader is open or close.

Figure 19C:
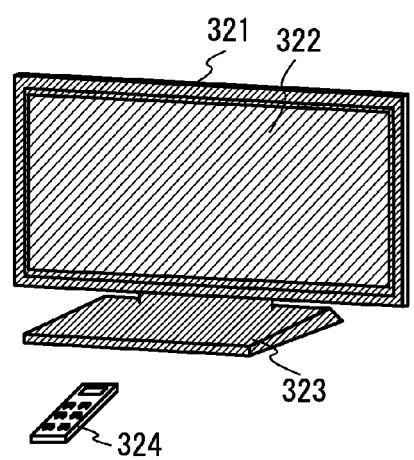

FIG. 19C illustrates a television device including a housing 321, a display portion 322, a stand 323, and the like. The television device can be controlled by a switch of the housing 321 and a remote controller 324. The housing 321 and the remote controller 324 are provided with an electronic component including the logic block 100 or the like of the foregoing embodiment, which functions as a reconfigurable circuit. Consequently, it is possible to obtain a low-power television device with a smaller number of wirings between circuits.

Note that the configuration of the logic block 100 or the like, which is incorporated in the television device, can be changed in accordance with ambient light or the position of the viewer. For example, using a multi-context function, the logic block 100 or the like may execute different kinds of arithmetic depending on whether a room is bright or dark or whether the viewer is close to or distant from the television device.

Figure 19D:
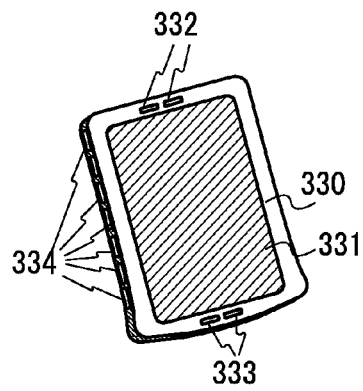

FIG. 19D illustrates a smartphone in which a main body 330 is provided with a display portion 331, a speaker 332, a microphone 333, an operation button 334, and the like. An electronic component including the logic block 100 or the like of the foregoing embodiment, which functions as a reconfigurable circuit, is provided in the main body 330. It is thus possible to obtain a low-power smartphone with a smaller number of wirings between circuits.

Note that the configuration of the logic block 100 or the like, which is incorporated in the smartphone, can be changed in accordance with ambient light or the position of the user. For example, using a multi-context function, the logic block 100 or the like may execute different kinds of arithmetic depending on whether an image is displayed or not.

Figure 19E:
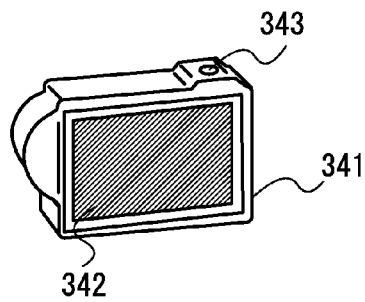

FIG. 19E illustrates a digital camera including a main body 341, a display portion 342, an operation switch 343, and the like. An electronic component including the logic block 100 or the like of the foregoing embodiment, which functions as a reconfigurable circuit, is provided in the main body 341. It is thus possible to obtain a low-power digital camera with a smaller number of wirings between circuits.

Note that the configuration of the logic block 100 or the like, which is incorporated in the digital camera, can be changed in accordance with a shooting mode. For example, using a multi-context function, the logic block 100 or the like may execute different kinds of arithmetic between a still image shooting mode and a moving image shooting mode.

As has been described, the electronic component including the logic block 100 or the like of the foregoing embodiment, which functions as a reconfigurable circuit, is provided in the electronic device shown in this embodiment, resulting in lower power consumption and a smaller number of wirings between circuits in the electronic device.

This application is based on Japanese Patent Application serial no. 2015-040855 filed with Japan Patent Office on Mar. 3, 2015, the entire contents of which are hereby incorporated by reference.

What is claimed is:

1. An electronic device comprising:
   a plurality of switch matrix arrays;
   a plurality of logic elements corresponding to the respective switch matrix arrays; and
   a plurality of wirings,
   wherein each of the plurality of switch matrix arrays is configured to select at least one wiring among the plurality of wirings and input, to the corresponding logic element, a signal transmitted through the at least one wiring,
   wherein one of two adjacent logic elements among the plurality of logic elements is configured to generate a context selection signal by using a signal input to the one of the two adjacent logic elements through at least one of the plurality of wirings, and
   wherein an output of the one of the two adjacent logic elements is electrically connected to the other of the two adjacent logic elements so that the one of the two adjacent logic elements supplies the context selection signal to the other of the two adjacent logic elements.

2. The electronic device according to claim 1, wherein the context selection signal is generated by using a clock signal.

3. The electronic device according to claim 1, further comprising a transistor comprising an oxide semiconductor in a channel formation region.

4. The electronic device according to claim 1, wherein each of the plurality of switch matrix arrays comprises a transistor and a memory.

5. The electronic device according to claim 1,
   wherein each of the plurality of switch matrix arrays comprises a transistor and a memory, and
   wherein the transistor comprises an oxide semiconductor in a channel formation region.

6. The electronic device according to claim 1, wherein each of the plurality of logic elements comprises a flip-flop and multiplexer.

7. The electronic device according to claim 1, wherein the output of the one of the two adjacent logic elements is directly connected to the other of the two adjacent logic elements.

8. An electronic device comprising:
   a first logic element;
   a second logic element adjacent to the first logic element;

a first switch matrix array corresponding to the first logic element;
a second switch matrix array corresponding to the second logic element; and
a plurality of wirings,
wherein the first switch matrix array is configured to select at least one of the plurality of wirings and input a first signal to the first logic element,
wherein the second switch matrix array is configured to select at least one of the plurality of wirings and input a second signal to the second logic element,
wherein the first logic element is configured to generate a context selection signal by using part or all of the first signal, and
wherein an output of the first logic element is electrically connected to the second logic element so that the first logic element supplies the context selection signal to the second logic element.

9. The electronic device according to claim 8, wherein the context selection signal is generated by using a clock signal.

10. The electronic device according to claim 8, further comprising a transistor comprising an oxide semiconductor in a channel formation region.

11. The electronic device according to claim 8, wherein each of the first switch matrix array and the second switch matrix array comprises a transistor and a memory.

12. The electronic device according to claim 8,
wherein each of the first switch matrix array and the second switch matrix array comprises a transistor and a memory, and
wherein the transistor comprises an oxide semiconductor in a channel formation region.

13. The electronic device according to claim 8, wherein each of the first logic element and the second logic element comprises a flip-flop and multiplexer.

14. The electronic device according to claim 8, wherein the output of the first logic element is directly connected to the second logic element.

* * * * *